United States Patent
Tsuda

(10) Patent No.: US 9,893,080 B2
(45) Date of Patent: Feb. 13, 2018

(54) SEMICONDUCTOR DEVICE HAVING A DIVERSE SHAPED COLUMNAR PORTION

(71) Applicant: Toshiba Memory Corporation, Minato-ku, Tokyo (JP)

(72) Inventor: Muneyuki Tsuda, Ichinomiya Aichi (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/207,410

(22) Filed: Jul. 11, 2016

(65) Prior Publication Data

US 2017/0256560 A1 Sep. 7, 2017

Related U.S. Application Data

(60) Provisional application No. 62/304,069, filed on Mar. 4, 2016.

(51) Int. Cl.
*H01L 27/11* (2006.01)
*H01L 29/06* (2006.01)
*H01L 27/11582* (2017.01)

(52) U.S. Cl.
CPC .... *H01L 27/11582* (2013.01); *H01L 29/0657* (2013.01)

(58) Field of Classification Search
CPC .............. H01L 27/11582; H01L 29/0657
See application file for complete search history.

(56) References Cited

U.S. PATENT DOCUMENTS

| 6,933,556 | B2* | 8/2005 | Endoh | H01L 27/115 257/314 |
| 7,539,056 | B2 | 5/2009 | Katsumata et al. | |
| 8,178,919 | B2* | 5/2012 | Fujiwara | H01L 27/11524 257/319 |
| 8,455,940 | B2* | 6/2013 | Lee | H01L 27/11565 257/288 |
| 8,674,426 | B2* | 3/2014 | Higuchi | H01L 27/11578 257/316 |
| 9,159,739 | B2* | 10/2015 | Makala | H01L 27/11551 |
| 9,177,613 | B2* | 11/2015 | Lee | H01L 27/11519 |
| 9,530,697 | B1* | 12/2016 | Nakaki | H01L 21/823487 |
| 9,570,464 | B1* | 2/2017 | Wakatsuki | H01L 27/11582 |

(Continued)

FOREIGN PATENT DOCUMENTS

JP 06338602 A 12/1994

*Primary Examiner* — Ida M Soward
(74) *Attorney, Agent, or Firm* — Holtz, Holtz & Volek PC

(57) ABSTRACT

A surface area of a transverse cross section of an upper portion of a columnar portion is greater than a surface area of a transverse cross section of a lower portion of the columnar portion. A configuration of the transverse cross section of the upper portion is a triangle or a pseudo-triangle having three corners, or a quadrilateral or a pseudo-quadrilateral having four corners. A configuration of the transverse cross section of the lower portion is substantially a circle. The upper portion of the columnar portion is adjacent to an upper layer portion of a stacked body including a control gate of an uppermost layer of control gates. The lower portion of the columnar portion is adjacent to a lower layer portion of the stacked body including a control gate of a lowermost layer of the control gates.

2 Claims, 23 Drawing Sheets

(56) References Cited

U.S. PATENT DOCUMENTS

| | | |
|---|---|---|
| 9,659,957 B2* | 5/2017 | Aoyama ............ H01L 27/11582 |
| 9,666,594 B2* | 5/2017 | Mizuno ............. H01L 27/11582 |
| 2010/0097858 A1 | 4/2010 | Tokiwa et al. |
| 2011/0012188 A1* | 1/2011 | Kito .................. H01L 27/11578 |
| | | 257/324 |
| 2012/0256247 A1* | 10/2012 | Alsmeier .............. H01L 21/764 |
| | | 257/319 |
| 2012/0300527 A1* | 11/2012 | Shim ...................... G11C 5/147 |
| | | 365/51 |
| 2013/0175603 A1* | 7/2013 | Cho .................. H01L 27/11578 |
| | | 257/324 |
| 2014/0021525 A1* | 1/2014 | Masuoka .......... H01L 27/11521 |
| | | 257/315 |
| 2014/0284607 A1* | 9/2014 | Fukuzumi ......... H01L 27/11582 |
| | | 257/66 |
| 2015/0001460 A1 | 1/2015 | Kim et al. |
| 2015/0060992 A1* | 3/2015 | Taekyung ........... H01L 29/7926 |
| | | 257/324 |
| 2015/0060998 A1* | 3/2015 | Mizushima ......... H01L 29/7827 |
| | | 257/330 |
| 2015/0109862 A1* | 4/2015 | Shibata .................... G11C 8/14 |
| | | 365/185.12 |
| 2017/0025436 A1* | 1/2017 | Takahashi ......... H01L 27/11582 |
| 2017/0069651 A1* | 3/2017 | Sakamoto ......... H01L 27/11582 |
| 2017/0077127 A1* | 3/2017 | Noda ................ H01L 27/11582 |
| 2017/0148808 A1* | 5/2017 | Nishikawa ............ H01L 23/528 |
| 2017/0148811 A1* | 5/2017 | Zhang .............. H01L 27/11582 |
| 2017/0207236 A1* | 7/2017 | Kitamura .......... H01L 27/11582 |
| 2017/0236834 A1* | 8/2017 | Fukumura ......... H01L 27/11582 |
| | | 257/314 |
| 2017/0243878 A1* | 8/2017 | Kim .................... H01L 27/1157 |

* cited by examiner

PERFECT CIRCLE

TRIANGLE A

TRIANGLE B

TRIANGLE C

SEMICONDUCTOR DEVICE HAVING A DIVERSE SHAPED COLUMNAR PORTION

CROSS-REFERENCE TO RELATED APPLICATION

This application is based upon and claims the benefit of priority from U.S. Provisional Patent Application 62/304,069, filed on Mar. 4, 2016; the entire contents of which are incorporated herein by reference.

FIELD

Embodiments described herein relate generally to a semiconductor device.

BACKGROUND

A three-dimensional memory cell device has been proposed in which a plurality of electrode layers are stacked on a substrate and caused to function as control gates of memory cells. A columnar portion including a semiconductor body functioning as a channel is formed inside a hole made in the stacked body including the electrode layers.

DETAILED DESCRIPTION

According to one embodiment, a semiconductor device includes a foundation layer, a stacked body, and a columnar portion. The stacked body is provided above the foundation layer. The stacked body includes a plurality of electrode layers stacked with an insulator interposed. The columnar portion has an upper portion and a lower portion. The columnar portion includes a semiconductor body extending in a stacking direction through the stacked body. A surface area of a transverse cross section of the upper portion of the columnar portion is greater than a surface area of a transverse cross section of the lower portion of the columnar portion. A configuration of the transverse cross section of the upper portion is a triangle or a pseudo-triangle having three corners. A configuration of the transverse cross section of the lower portion resembles the configuration of the transverse cross section of the upper portion, and has three corners having smaller curvatures than the corners of the configuration of the transverse cross section of the upper portion.

For example, a semiconductor memory device that includes a memory cell array having a three-dimensional structure is described as a semiconductor device in the embodiment.

Figure 1:
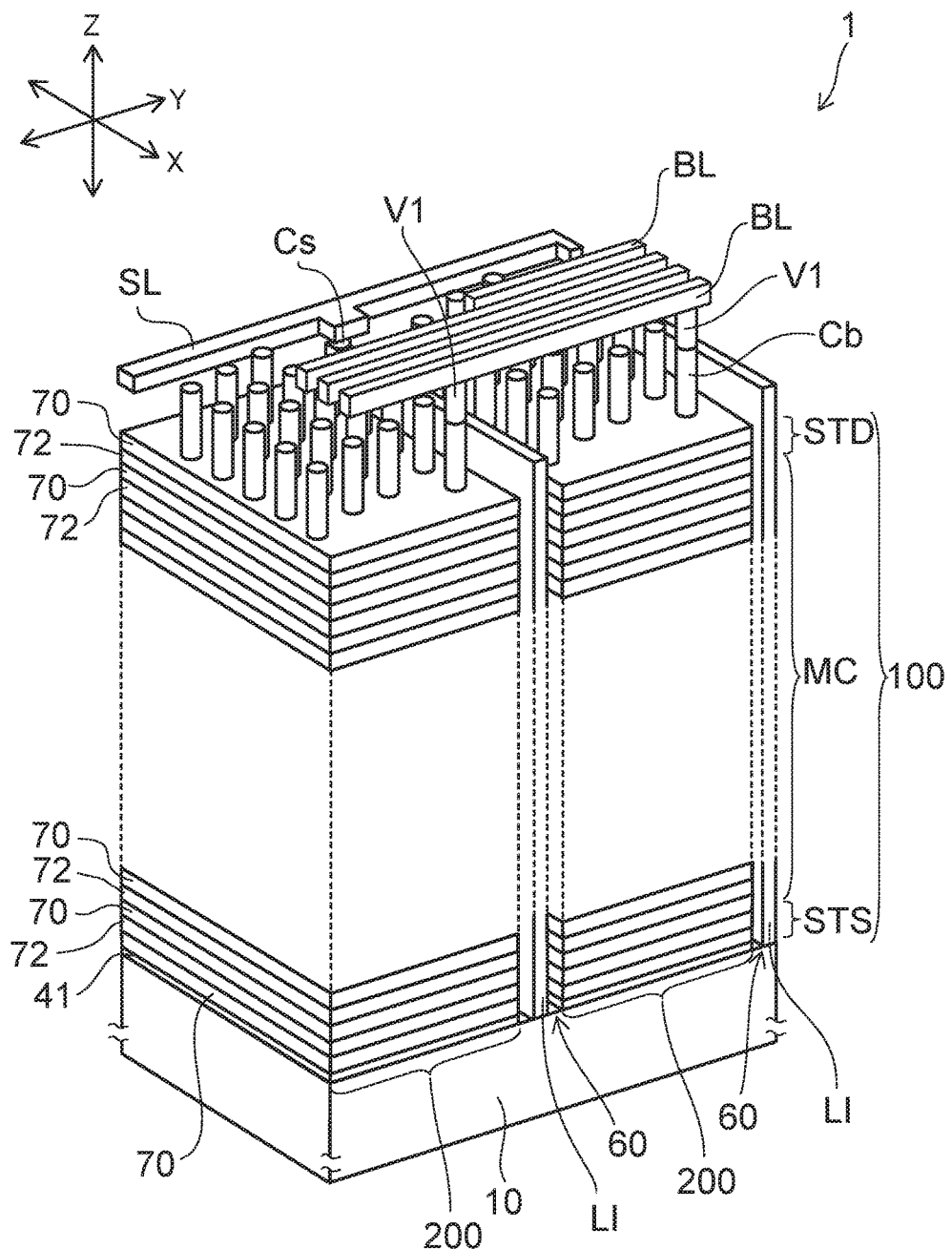
FIG. 1 is a schematic perspective view of a semiconductor device of an embodiment.

FIG. 1 is a schematic perspective view of the memory cell array 1 of the embodiment.

Figure 2:
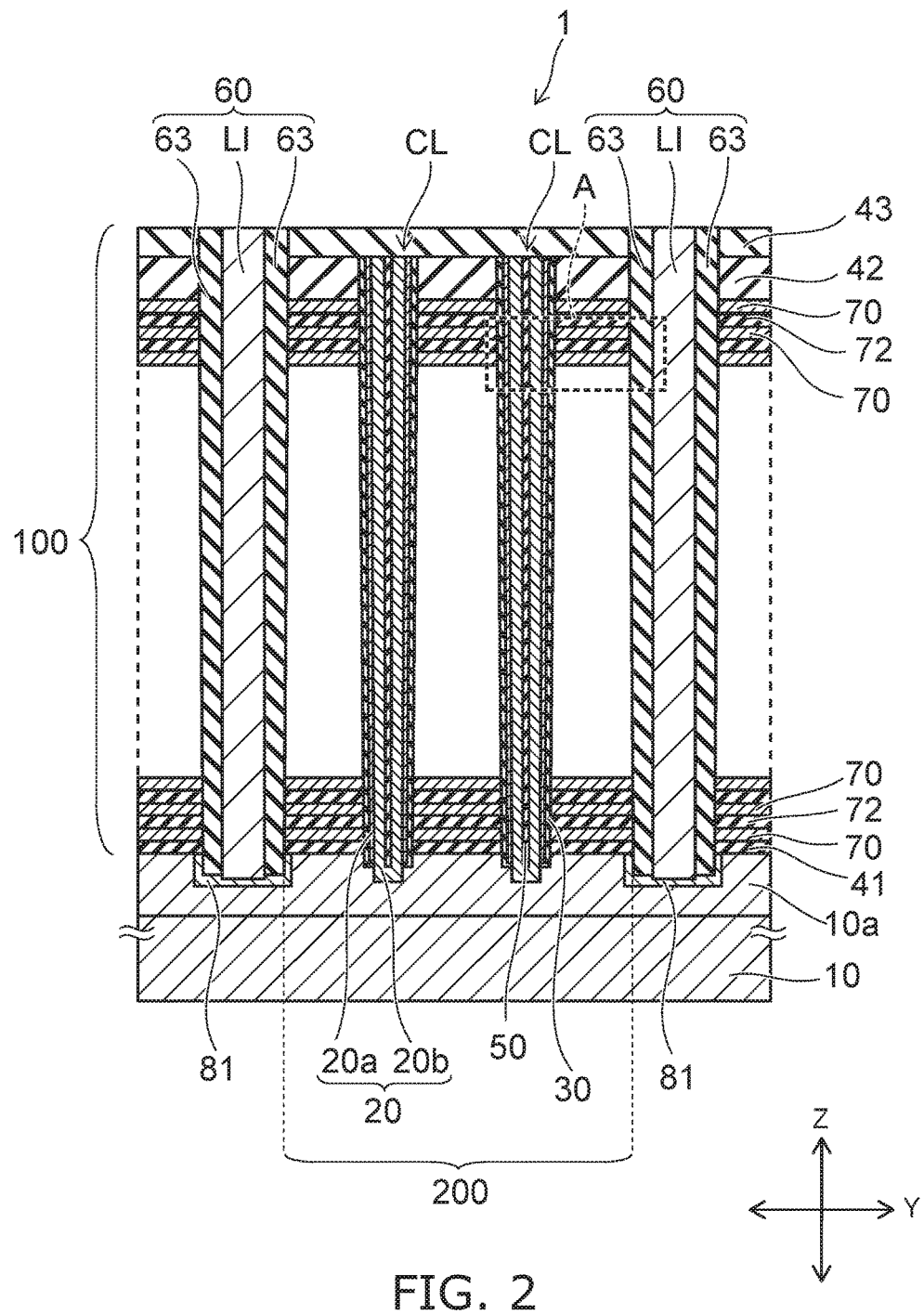
FIG. 2 is a schematic cross-sectional view of the semiconductor device of the embodiment.

FIG. 2 is a schematic cross-sectional view of the memory cell array 1 of the embodiment.

Figure 3:
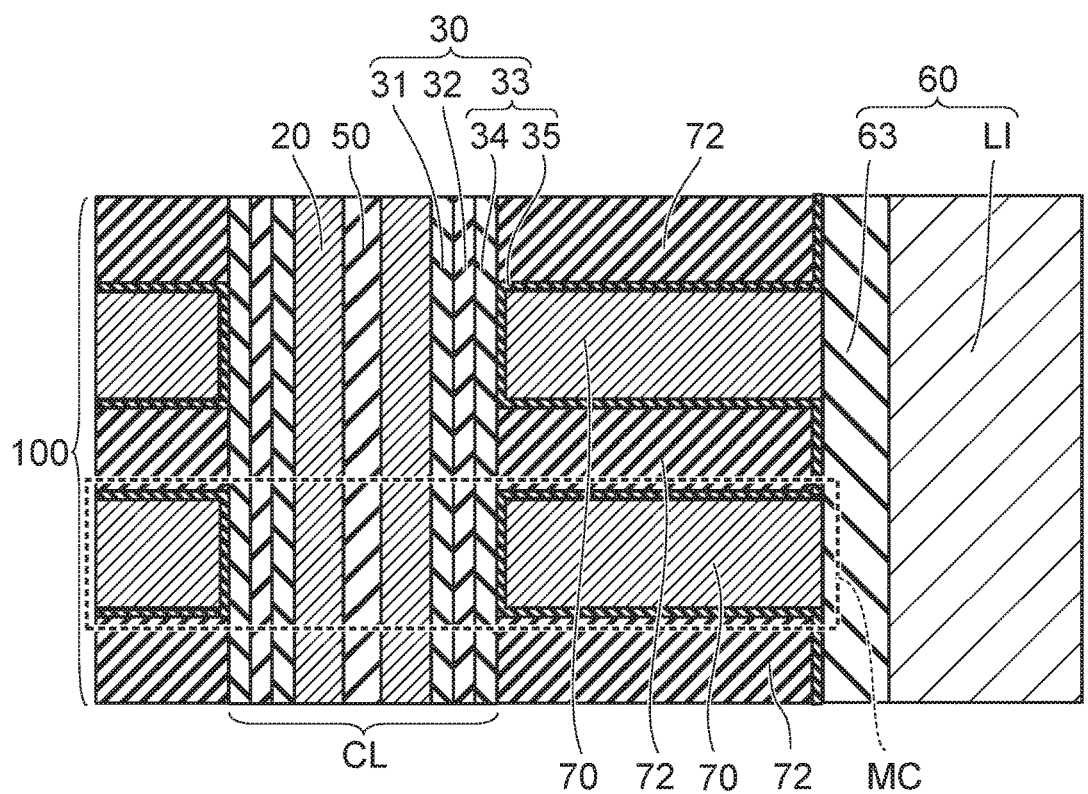
FIG. 3 is an enlarged cross-sectional view of a portion A of FIG. 2.

FIG. 3 is an enlarged cross-sectional view of a portion A of FIG. 2.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction). The Y-direction and the Z-direction shown in FIG. 2 correspond respectively to the Y-direction and the Z-direction shown in FIG. 1.

The memory cell array 1 includes the substrate 10, a stacked body 100 stacked on the substrate 10, a plurality of columnar portions CL, a plurality of separation portions 60, and upper layer interconnects provided above the stacked body 100. For example, bit lines BL and a source line SL are shown as the upper layer interconnects in FIG. 1.

Figure 4A:
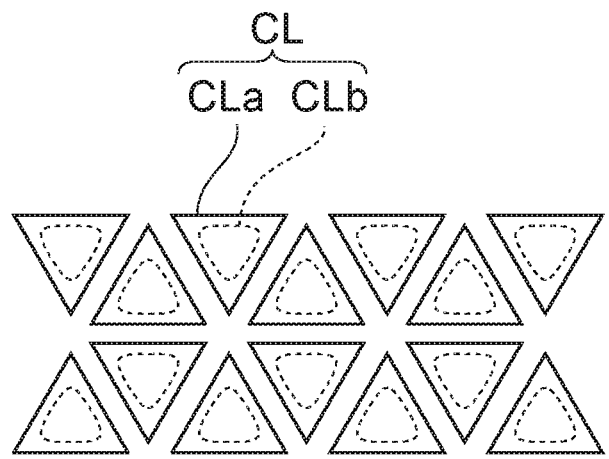
FIGS. 4A to 5B are schematic plan views of a columnar portion of the embodiment.

FIG. 4A is a schematic plan view of the columnar portions CL.

One columnar portion CL has an upper end portion CLa and a lower end portion CLb. FIG. 4A is a schematic view in which the lower end portions CLb are overlaid as broken lines in a top view of the upper surfaces of the upper end portions CLa of the columnar portions CL as viewed from above in the stacking direction of the stacked body 100. FIG. 4B to FIG. 5B described below also are schematic views similar to FIG. 4A.

Figure 6A:
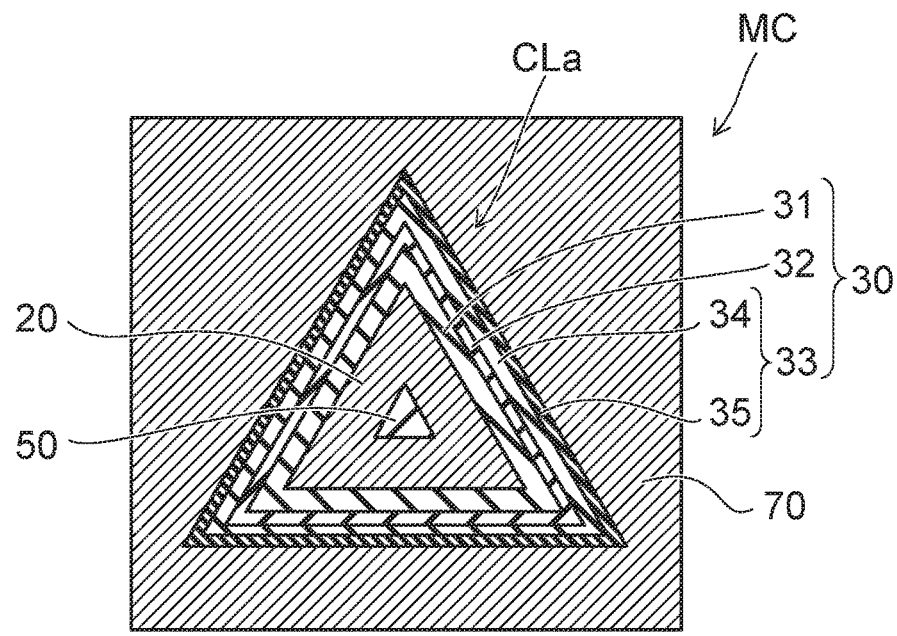
FIGS. 6A and 6B are schematic cross-sectional views of the columnar portion of the embodiment.
Figure 6B:
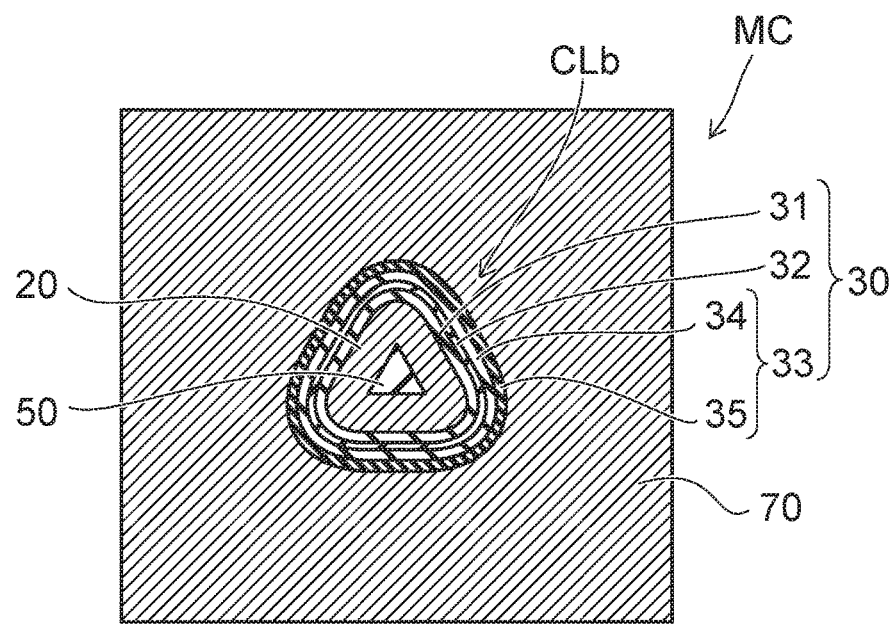

FIG. 6A is a schematic cross-sectional view of the upper end portion CLa of the columnar portion CL; and FIG. 6B is a schematic cross-sectional view of the lower end portion CLb of the columnar portion CL. FIG. 6A and FIG. 6B show transverse cross sections of a portion of the columnar portion CL surrounded with an electrode layer 70. Here, the transverse cross section is a cross section cut perpendicularly to the major axis (the Z-direction) of the columnar portion CL.

As shown in FIG. 2, the columnar portions CL extend in the stacking direction of the stacked body 100 (the Z-direction) through the stacked body 100. As shown in FIG. 1, the separation portions 60 spread in the X-direction and the stacking direction of the stacked body 100 (the Z-direction), and divide the stacked body 100 into a plurality of blocks (or finger portions) 200 in the Y-direction.

As shown in FIG. 4A, for example, the columnar portions CL have a staggered arrangement. Or, the columnar portions CL may have a square lattice arrangement along the X-direction and the Y-direction.

As shown in FIG. 1, the bit lines BL are provided above the stacked body 100. The bit lines BL are, for example, metal films extending in the Y-direction. The bit lines BL are separated from each other in the X-direction.

The upper ends of semiconductor bodies 20 of the columnar portions CL described below are connected to the bit lines BL via contacts Cb and contacts V1 shown in FIG. 1.

The plurality of columnar portions CL are connected to one common bit line BL. The columnar portions CL that are connected to the common bit line BL include one columnar portion CL selected from each block (or finger portion) 200 separated in the Y-direction by the separation portions 60.

As shown in FIG. 2, the stacked body 100 includes a plurality of electrode layers 70 stacked on the substrate 10. The electrode layers 70 are stacked, with an insulating layer 72 interposed, in a direction (the Z-direction) perpendicular to the major surface of the substrate 10.

The substrate 10 is, for example, a silicon substrate; and a p-type well 10a which is a p-type silicon region is provided as a semiconductive foundation layer on the front surface side of the substrate 10.

An insulating film 41 is provided on the front surface of the p-type well 10a. The lowermost electrode layer 70 is provided on the insulating film 41. An insulating film 42 is provided on the uppermost electrode layer 70; and an insulating film 43 is provided on the insulating film 42. The insulating film 43 covers the upper ends of the columnar portions CL.

As shown in FIG. 3, FIG. 6A, and FIG. 6B, the columnar portion CL includes a stacked film (a memory film) 30, the semiconductor body 20, and an insulative core film 50. The semiconductor body 20, the stacked film 30, and the core film 50 extend in the stacking direction of the stacked body 100.

The semiconductor body 20 is formed in a pipe-like configuration; and the core film 50 is provided on the inner side of the semiconductor body 20. The stacked film 30 is provided between the electrode layer 70 and the semiconductor body 20, and surrounds the periphery of the semiconductor body 20. The upper end of the semiconductor body 20 is connected to the bit line BL via the contact Cb and the contact V1 shown in FIG. 1. As shown in FIG. 2, the lower end of the semiconductor body 20 contacts the p-type well 10a of the substrate 10.

The stacked film 30 includes a tunneling insulating film 31, a charge storage film (a charge storage portion) 32, and a blocking insulating film 33. The blocking insulating film 33, the charge storage film 32, and the tunneling insulating film 31 are provided in order from the electrode layer 70 side between the electrode layer 70 and the semiconductor body 20. The charge storage film 32 is provided between the tunneling insulating film 31 and the blocking insulating film 33.

The semiconductor body 20, the stacked film 30, and the electrode layer 70 are included in a memory cell MC. The memory cell MC has a vertical transistor structure in which the electrode layer 70 surrounds, with the stacked film 30 interposed, the periphery of the semiconductor body 20.

The electrode layers 70 include an electrode layer 70 that opposes, with the charge storage film 32 interposed, the semiconductor body 20 and functions as a control gate of the memory cell MC having the vertical transistor structure. The semiconductor body 20 is, for example, a channel body of silicon. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film. The charge storage film 32 includes, for example, a silicon nitride film.

The tunneling insulating film 31 is used as a potential barrier when charge is injected from the semiconductor body 20 into the charge storage film 32, and when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes a first blocking film 34 and a second blocking film 35. The first blocking film 34 is, for example, a silicon oxide film. The second blocking film 35 is a metal oxide film having a higher dielectric constant than the silicon oxide film. The second blocking film 35 is, for example, an aluminum oxide film.

The first blocking film 34 is provided between the charge storage film 32 and the second blocking film 35. The second blocking film 35 is provided between the first blocking film 34 and the electrode layer 70.

The second blocking film 35 is provided also between the electrode layer 70 and the insulating layer 72. The second blocking film 35 is formed continuously along the upper surface of the electrode layer 70, the lower surface of the electrode layer 70, and the side surface of the electrode layer 70 on the stacked film 30 side. The second blocking film 35 is not continuous in the stacking direction of the stacked body 100 and is divided. Or, similarly to the first blocking film 34, the second blocking film 35 may be continuous in the stacking direction of the stacked body 100.

As shown in FIG. 1, the upper layer portion of the stacked body 100 includes a drain-side select transistor STD. At least the uppermost electrode layer 70 functions as a control gate of the drain-side select transistor STD.

The lower layer portion of the stacked body 100 includes a source-side select transistor STS. At least the lowermost electrode layer 70 functions as a control gate of the source-side select transistor STS.

The memory cells MC are provided between the drain-side select transistor STD and the source-side select transistor STS. The memory cells MC, the drain-side select transistor STD, and the source-side select transistor STS are connected in series via the semiconductor body 20 of the columnar portion CL, and are included in one memory string. For example, the memory strings have a staggered arrangement in the planar direction parallel to the XY plane; and the memory cells MC are provided three-dimensionally in the X-direction, the Y-direction, and the Z-direction.

The separation portion 60 will now be described.

As shown in FIG. 2, the separation portion 60 includes an interconnect portion LI and an insulating film 63. The insulating film 63 is not shown in FIG. 1.

The interconnect portion LI spreads in the X-direction and the Z-direction and is, for example, a film containing a metal. The insulating film 63 is provided at the side surface of the interconnect portion LI. The insulating film 63 is provided between the stacked body 100 and the interconnect portion LI.

A plurality of semiconductor regions 81 are formed in the front surface of the p-type well 10a. The lower end of the interconnect portion LI contacts the semiconductor region 81. The plurality of semiconductor regions 81 are provided to correspond to the plurality of interconnect portions LI. The semiconductor regions 81 include an n-type semiconductor region 81 and a p-type semiconductor region 81.

The interconnect portions LI include an interconnect portion LI connected to the n-type semiconductor region 81 and an interconnect portion LI connected to the p-type semiconductor region 81.

The upper end of the interconnect portion LI connected to the n-type semiconductor region 81 is connected to the source line SL via a contact Cs shown in FIG. 1.

A current can be caused to flow between the n-type semiconductor region 81 and the lower end of the semiconductor body 20 by controlling a potential applied to the lowermost electrode layer 70 to induce an n-channel (an inversion layer) in the front surface of the p-type well 10a between the n-type semiconductor region 81 and the lower end of the semiconductor body 20.

In a read-out operation, electrons are supplied from the interconnect portion LI to the semiconductor body 20 via the n-type semiconductor region 81 and the n-channel.

The upper end of the interconnect portion LI connected to the p-type semiconductor region 81 is connected to a not-shown upper layer interconnect. The p-type semiconductor region 81 supplies holes to the semiconductor body 20 via the p-type well 10a in an erasing operation.

The columnar portion CL will now be described in detail.

As shown in FIG. 4A, FIG. 6A, and FIG. 6B, the surface area of the transverse cross section of the upper end portion CLa of the columnar portion CL is greater than the surface area of the transverse cross section of the lower end portion CLb of the columnar portion CL. The surface area of the transverse cross section of the columnar portion CL decreases continuously or in steps from the upper end portion CLa toward the lower end portion CLb.

Or, the columnar portion CL is formed in a so-called bowed configuration having a maximum transverse cross-sectional area at a portion between the upper end portion CLa and the lower end portion CLb.

The configuration of the transverse cross section of the upper end portion CLa is a triangle or a pseudo-triangle. Here, for example, the triangle has three sharp corners; and the pseudo-triangle has three rounded corners.

The configuration of the transverse cross section of the lower end portion CLb resembles the configuration of the transverse cross section of the upper end portion CLa. And the configuration of the transverse cross section of the lower end portion CLb is a pseudo-triangle having three corners having smaller curvatures than the corners of the configuration of the transverse cross section of the upper end portion CLa.

As shown in FIG. 4A in which the upper end portion CLa and the lower end portion CLb are viewed as being overlaid in the stacking direction of the stacked body 100, the corners of the transverse cross section of the lower end portion CLb oppose the corners of the transverse cross section of the upper end portion CLa on the inner side of the corners of the transverse cross section of the upper end portion CLa.

FIG. 4B to FIG. 5B show other examples of the transverse cross-sectional configuration of the columnar portion CL.

In the columnar portions CL shown in FIG. 4B to FIG. 5B as well, the surface area of the transverse cross section of the upper end portion CLa is greater than the surface area of the transverse cross section of the lower end portion CLb.

Figure 4B:
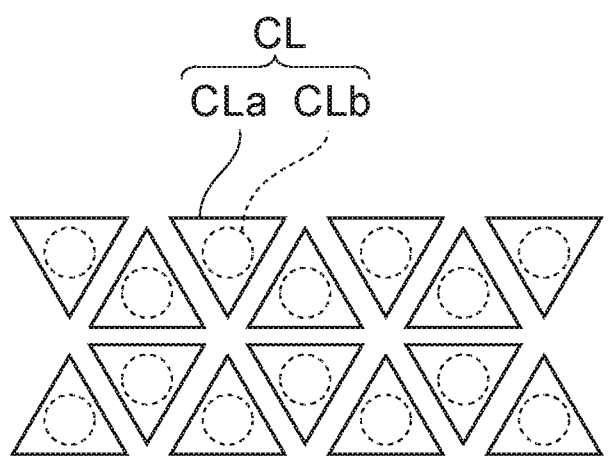

In the example shown in FIG. 4B, the configuration of the transverse cross section of the upper end portion CLa is a triangle or a pseudo-triangle. The configuration of the transverse cross section of the lower end portion CLb is substantially a circle. Here, substantially a circle is not limited to a perfect circle and includes a distorted circle.

Figure 5A:
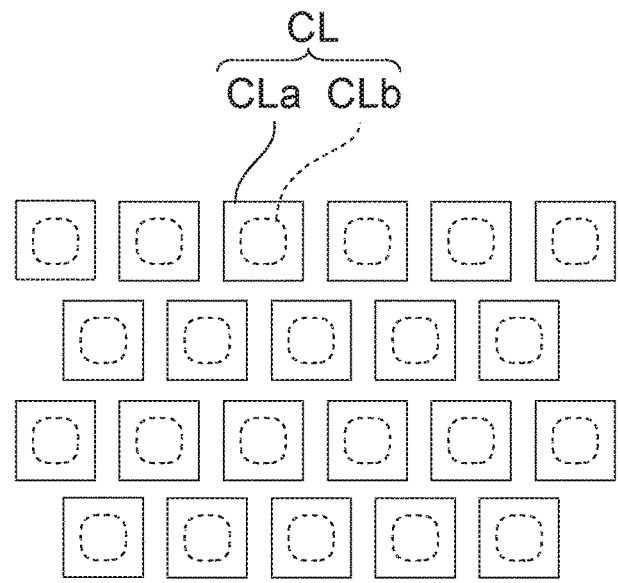

In the example shown in FIG. 5A, the configuration of the transverse cross section of the upper end portion CLa is a quadrilateral or a pseudo-quadrilateral. Here, for example, the quadrilateral has four corners that are right angles or nearly right angles. The pseudo-quadrilateral has four rounded corners.

The configuration of the transverse cross section of the lower end portion CLb shown in FIG. 5A resembles the configuration of the transverse cross section of the upper end portion CLa, and is a pseudo-quadrilateral having four corners having smaller curvatures than the corners of the configuration of the transverse cross section of the upper end portion CLa.

As shown in FIG. 5A in which the upper end portion CLa and the lower end portion CLb are viewed as being overlaid in the stacking direction of the stacked body 100, the corners of the transverse cross section of the lower end portion CLb oppose the corners of the transverse cross section of the upper end portion CLa on the inner side of the corners of the transverse cross section of the upper end portion CLa.

Figure 5B:
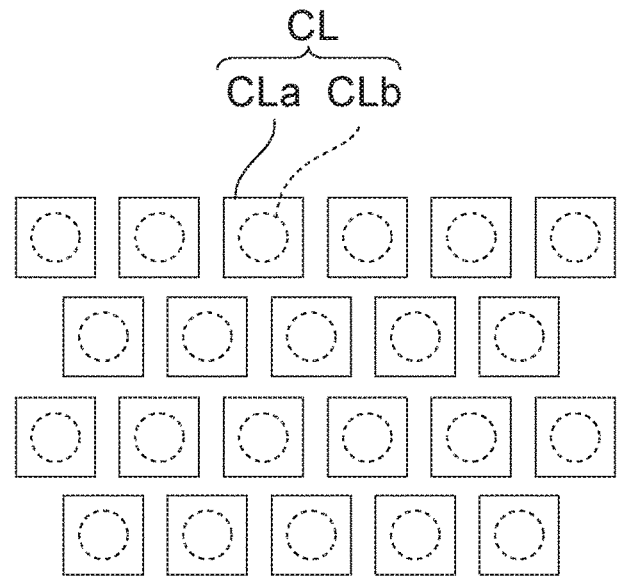

In the example shown in FIG. 5B, the configuration of the transverse cross section of the upper end portion CLa is a quadrilateral or a pseudo-quadrilateral. The configuration of the transverse cross section of the lower end portion CLb is substantially a circle similar to that of FIG. 4B.

The upper end portion CLa of the columnar portion CL is adjacent to the upper layer portion of the stacked body 100. The upper layer portion of the stacked body 100 includes the uppermost electrode layer 70. Also, the upper layer portion of the stacked body 100 includes the electrode layer 70 that functions as the control gate of the memory cell MC of the uppermost layer. The upper layer portion of the stacked body 100 including the uppermost electrode layer 70 and the control gate of the memory cell MC of the uppermost layer surrounds the upper end portion CLa.

The lower end portion CLb of the columnar portion CL is adjacent to the lower layer portion of the stacked body 100. The lower layer portion of the stacked body 100 includes the lowermost electrode layer 70. Also, the lower layer portion of the stacked body 100 includes the electrode layer 70 that functions as the control gate of the memory cell MC of the lowermost layer. The lower layer portion of the stacked body 100 including the lowermost electrode layer 70 and the control gate of the memory cell MC of the lowermost layer surrounds the lower end portion CLb.

A method for manufacturing the semiconductor device of the embodiment will now be described with reference to FIG. 7 to FIG. 17.

Figure 7:
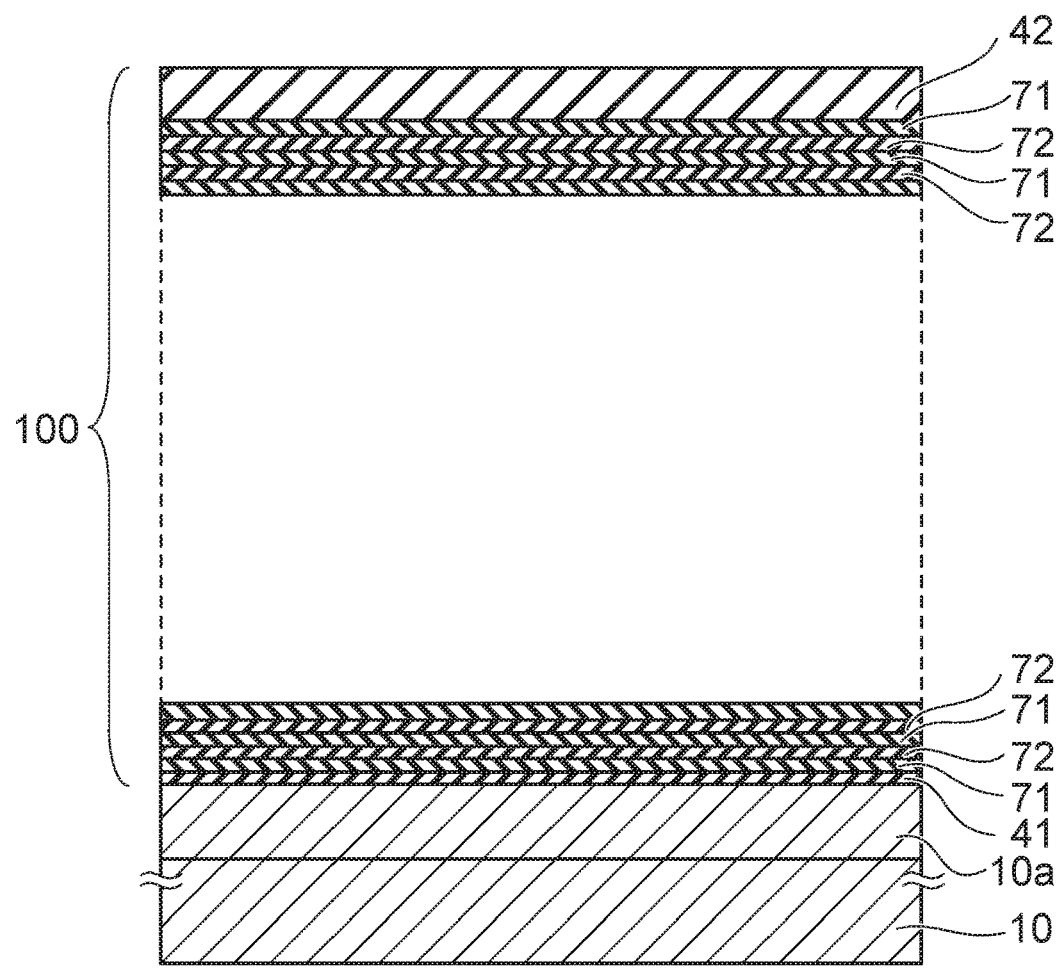
FIGS. 7 to 18 are schematic cross-sectional views showing a method for manufacturing the semiconductor device of the embodiment.

As shown in FIG. 7, the stacked body 100 is formed on the p-type well 10a of the substrate 10. The substrate 10 is a silicon substrate containing silicon as a major component. The insulating film 41 is formed on the p-type well 10a. The process in which a sacrificial layer 71 as a first layer and the insulating layer 72 as a second layer are stacked alternately on the insulating film 41 is repeated. For example, the sacrificial layer 71 is a silicon nitride layer; and the insulating layer 72 is a silicon oxide layer.

The lowermost sacrificial layer 71 is formed on the insulating film 41; and the lowermost insulating layer 72 is formed on the lowermost sacrificial layer 71. The insulating film 42 is formed on the uppermost sacrificial layer 71.

Figure 8:
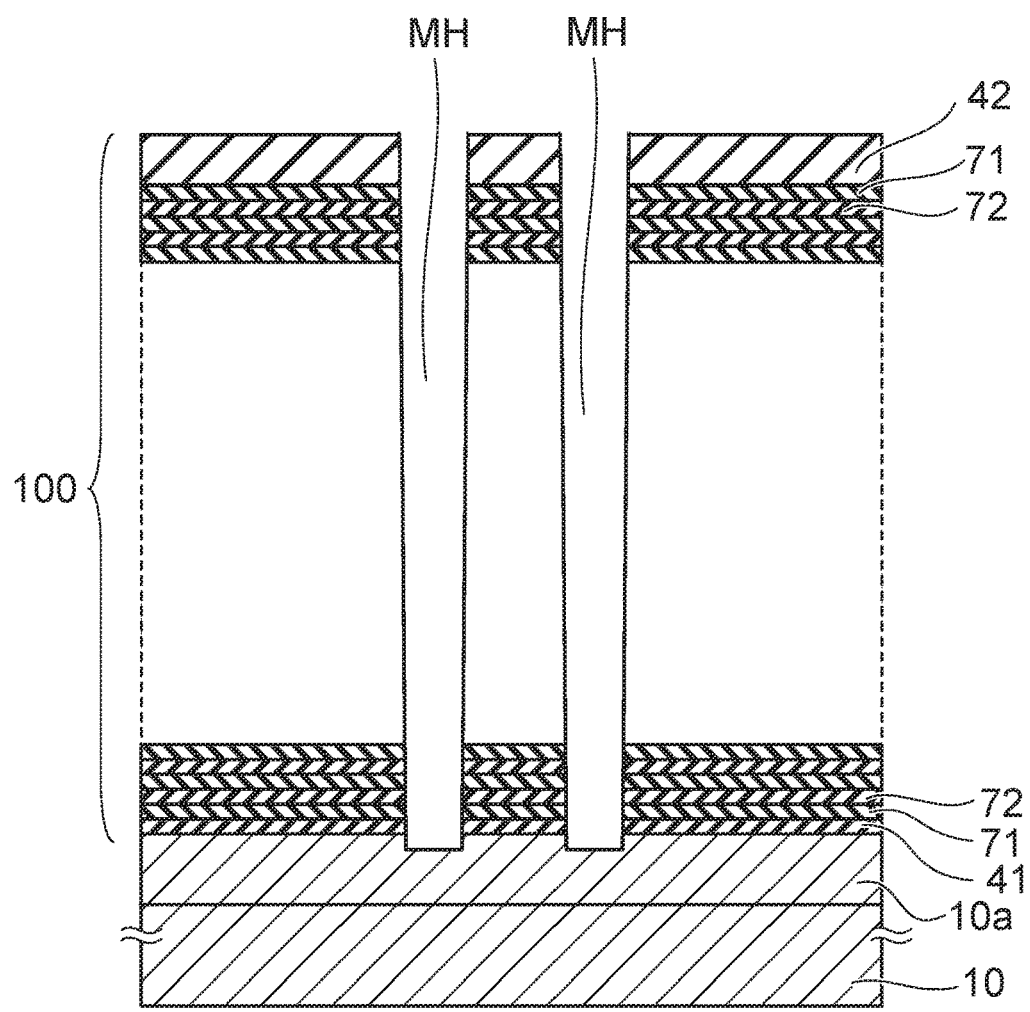

Then, as shown in FIG. 8, a plurality of memory holes MH are made in the stacked body 100. The memory holes MH are made by reactive ion etching (RIE) using a not-shown mask layer formed on the stacked body 100. The memory holes MH pierce the stacked body 100 and reach the p-type well 10a of the substrate 10.

Increasing the layers of the electrode layers 70 and fine memory holes MH are desirable for the progress of increasing the density of the memory cells MC in the stacking direction and the planar direction. This increases the aspect ratio of the memory hole MH. When making the memory hole MH having such a high aspect ratio by RIE, compared to the upper portion of the memory hole MH, the supply amount of the radicals at the lower portion of the memory hole MH decreases easily and the energy of the ions reaching the lower portion decreases easily.

Therefore, there is a tendency for the lower portion of the memory hole MH having the high aspect ratio to be finer than the upper portion. Accordingly, the transverse cross-sectional area of the lower end portion CLb of the columnar portion CL formed inside the memory hole MH in a subsequent process becomes less than the transverse cross-sectional area of the upper end portion CLa.

In the embodiment, a plurality of openings that match the arrangement of the plurality of columnar portions CL shown in FIG. 4A and FIG. 4B are made in the mask layer used in the RIE that makes the memory holes MH. The planar configuration of the opening of the mask layer is a triangle or a pseudo-triangle matching the configuration of the upper end portion CLa of the columnar portion CL. The transverse cross-sectional configuration of the upper portion of the memory hole MH made by the RIE using the mask layer is a triangle or a pseudo-triangle.

Or, a plurality of openings that match the arrangement of the plurality of columnar portions CL shown in FIG. 5A and FIG. 5B are made in the mask layer used in the RIE that makes the memory holes MH. The planar configuration of the opening of the mask layer is a quadrilateral or a pseudo-quadrilateral matching the configuration of the upper end portion CLa of the columnar portion CL. The transverse cross-sectional configuration of the upper portion of the memory hole MH made in the RIE using the mask layer is a quadrilateral or a pseudo-quadrilateral.

To prevent the degradation of the shape controllability of the memory hole MH due to asymmetric erosion of the mask layer in the RIE, it is desirable for the spacing between opposing sides of the openings of the mask layer to be substantially equal and for the openings to be arranged in a symmetric pattern having periodicity.

Then, when the etching has progressed to the lower layer portion of the stacked body 100 or in the latter half of the etching step, the conditions of the RIE are changed; and the anisotropy is weakened. The ratio of the rate of the side etching to the rate of the etching in the depth direction is set to be higher than when etching the upper layer portion of the stacked body 100.

When making the memory holes MH, the number of times the RIE conditions are changed is not limited to one time; and the conditions may be changed a plurality of times. Also, the modification of the RIE conditions may be in stages or continuous along the time axis.

By such RIE control, the corners of the lower portion of the memory hole MH have smaller curvatures than the corners of the upper portion. In other words, the transverse cross-sectional configuration of the lower portion of the memory hole MH is a pseudo-triangle, a pseudo-quadrilateral, or substantially a circle having corners having smaller curvatures than the transverse cross-sectional configuration of the upper portion.

Figure 9:
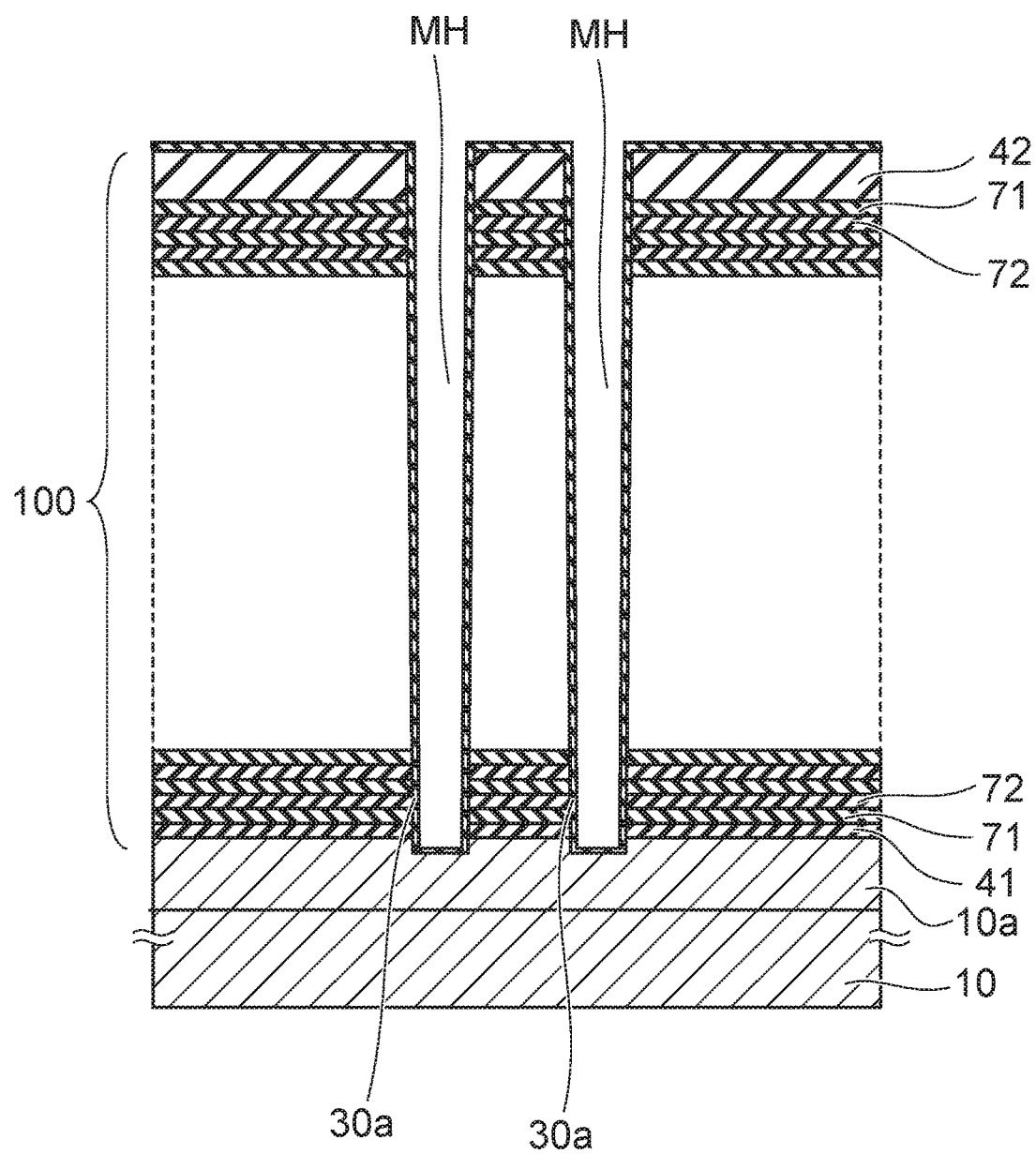

As shown in FIG. 9, a stacked film 30a is formed inside the memory holes MH. The stacked film 30a includes the first blocking film 34, the charge storage film 32, and the tunneling insulating film 31 of the stacked film 30 shown in FIG. 3. The stacked film 30a is formed conformally along the side surfaces and bottoms of the memory holes MH.

Figure 10:
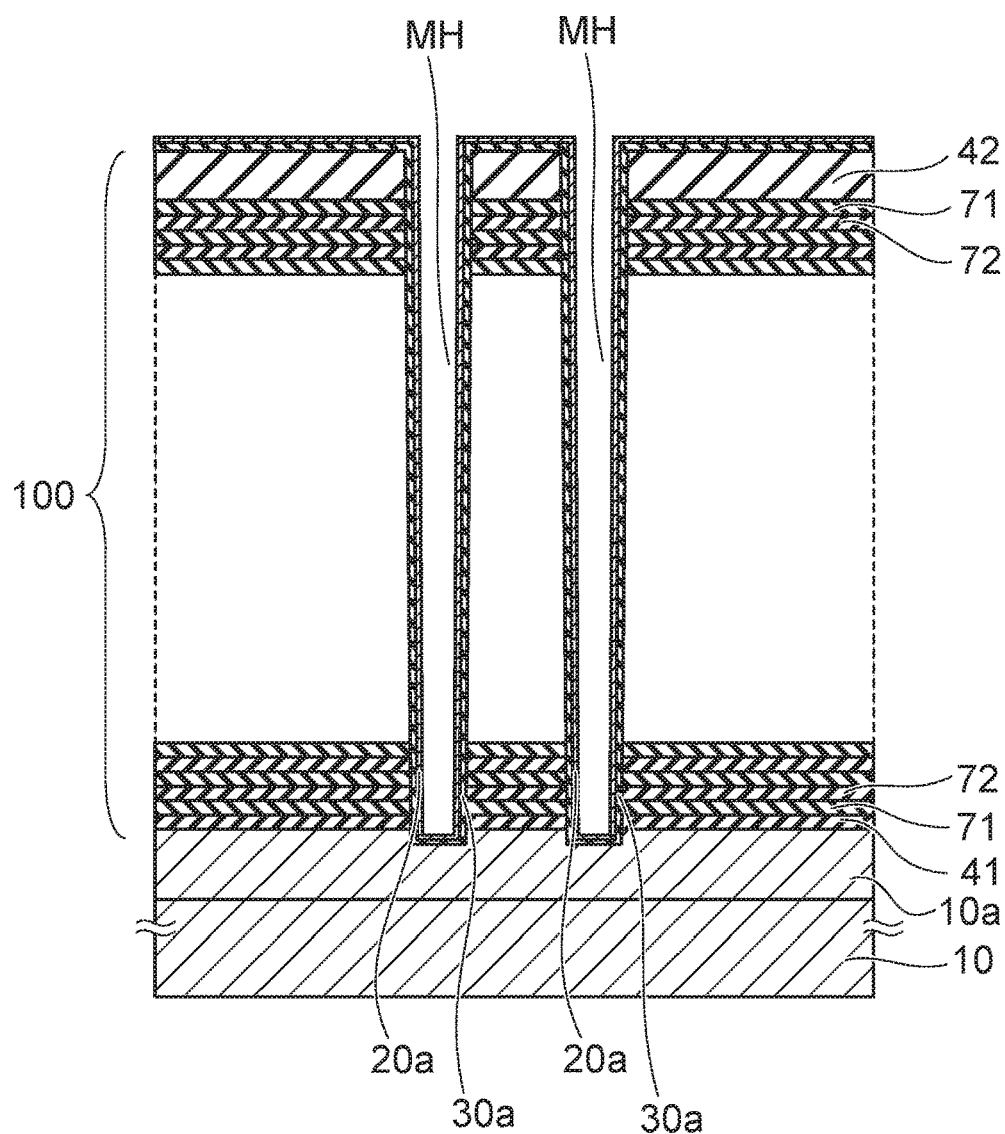

As shown in FIG. 10, cover silicon 20a is formed on the inner side of the stacked film 30a. The cover silicon 20a is formed conformally along the side surfaces and bottoms of the memory holes MH.

Figure 11:
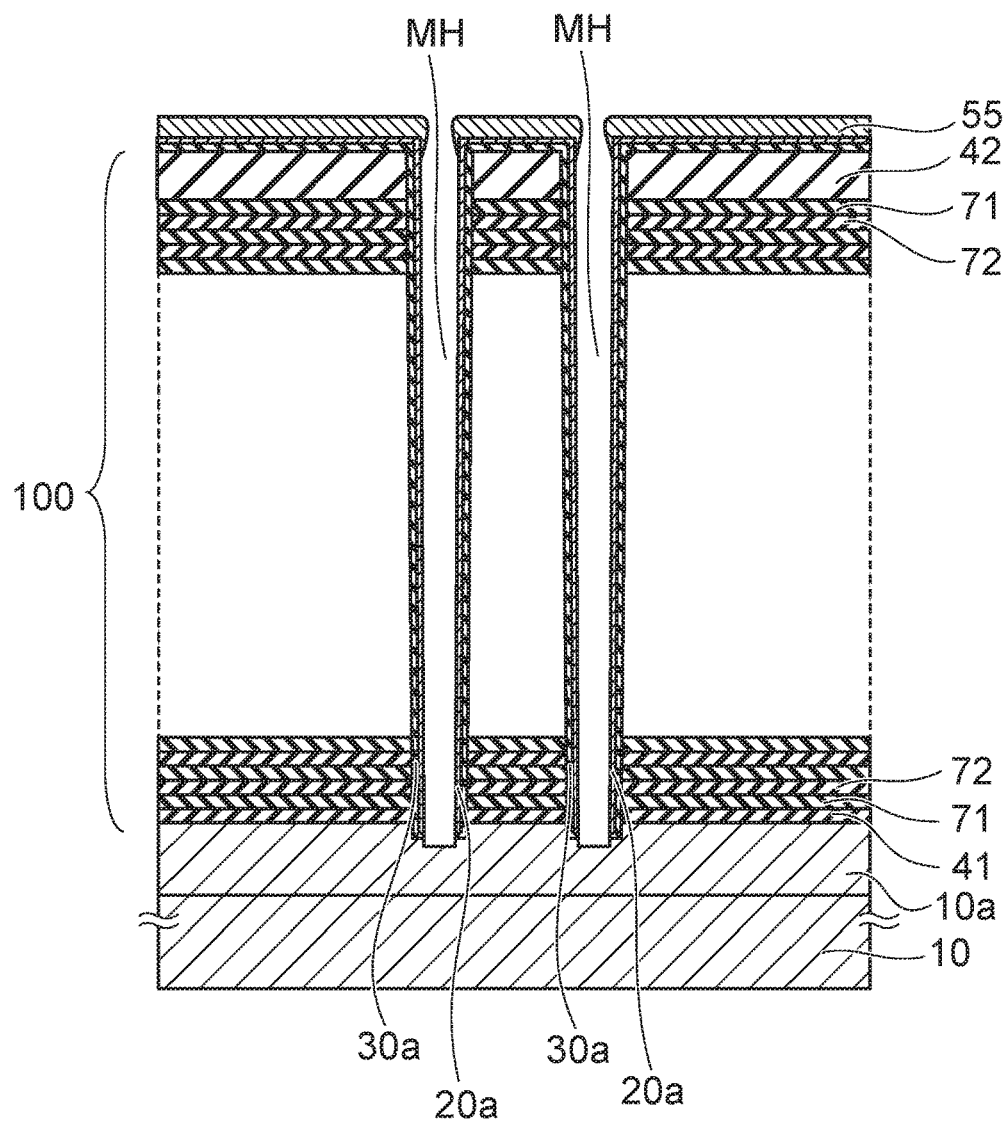

Then, as shown in FIG. 11, a mask layer 55 is formed on the stacked body 100; and the cover silicon 20a and the stacked film 30a deposited on the bottoms of the memory holes MH are removed by RIE. In the RIE, the stacked film 30a formed on the side surfaces of the memory holes MH is covered with and protected by the cover silicon 20a and is not damaged by the RIE.

Figure 12:
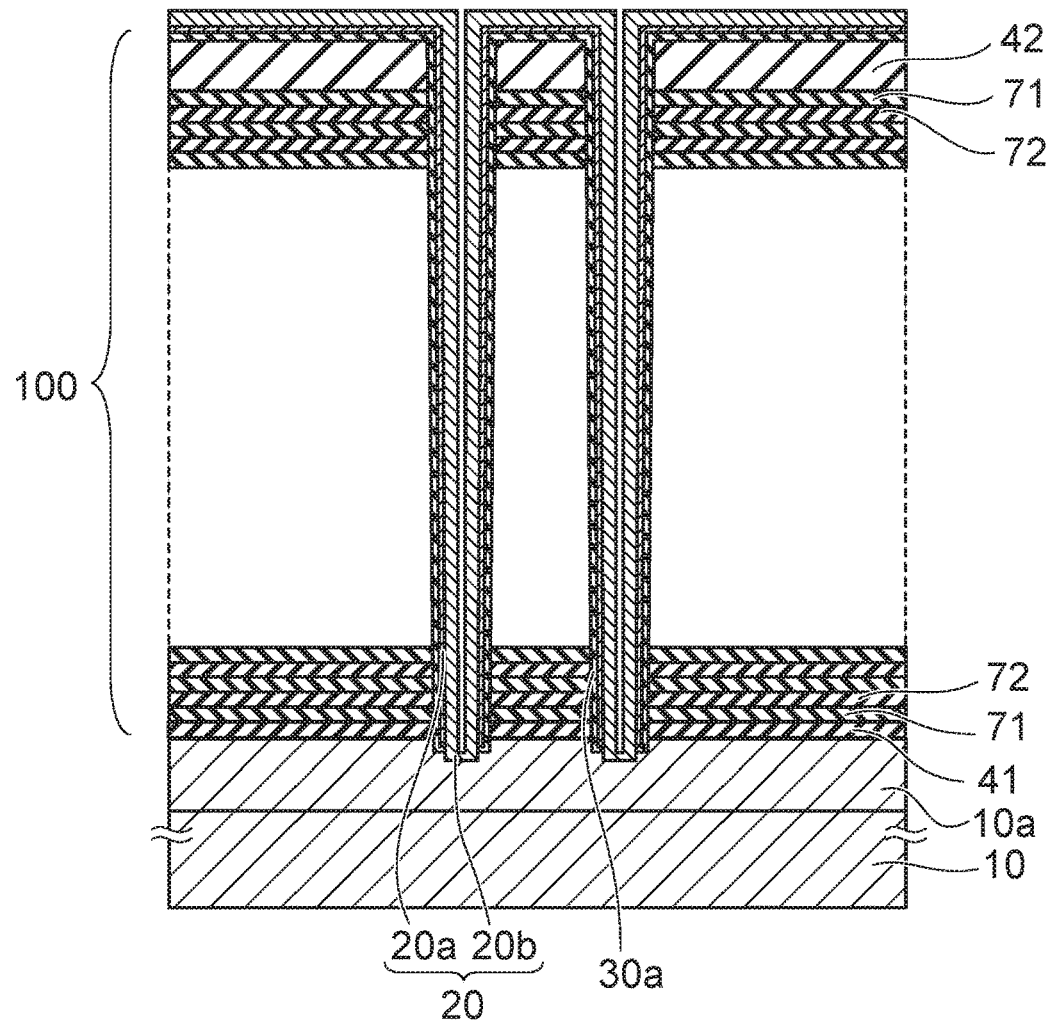

After removing the mask layer 55, a silicon body 20b is formed inside the memory holes MH as shown in FIG. 12. The silicon body 20b is formed on the side surface of the cover silicon 20a and on the bottoms of the memory holes MH where the substrate 10 is exposed. The lower end portion of the silicon body 20b contacts the p-type well 10a of the substrate 10.

The cover silicon 20a and the silicon body 20b are included in the semiconductor body 20 described above by, for example, forming the cover silicon 20a and the silicon body 20b as amorphous silicon films and subsequently crystallizing the amorphous silicon films into polycrystalline silicon films by heat treatment.

Figure 13:
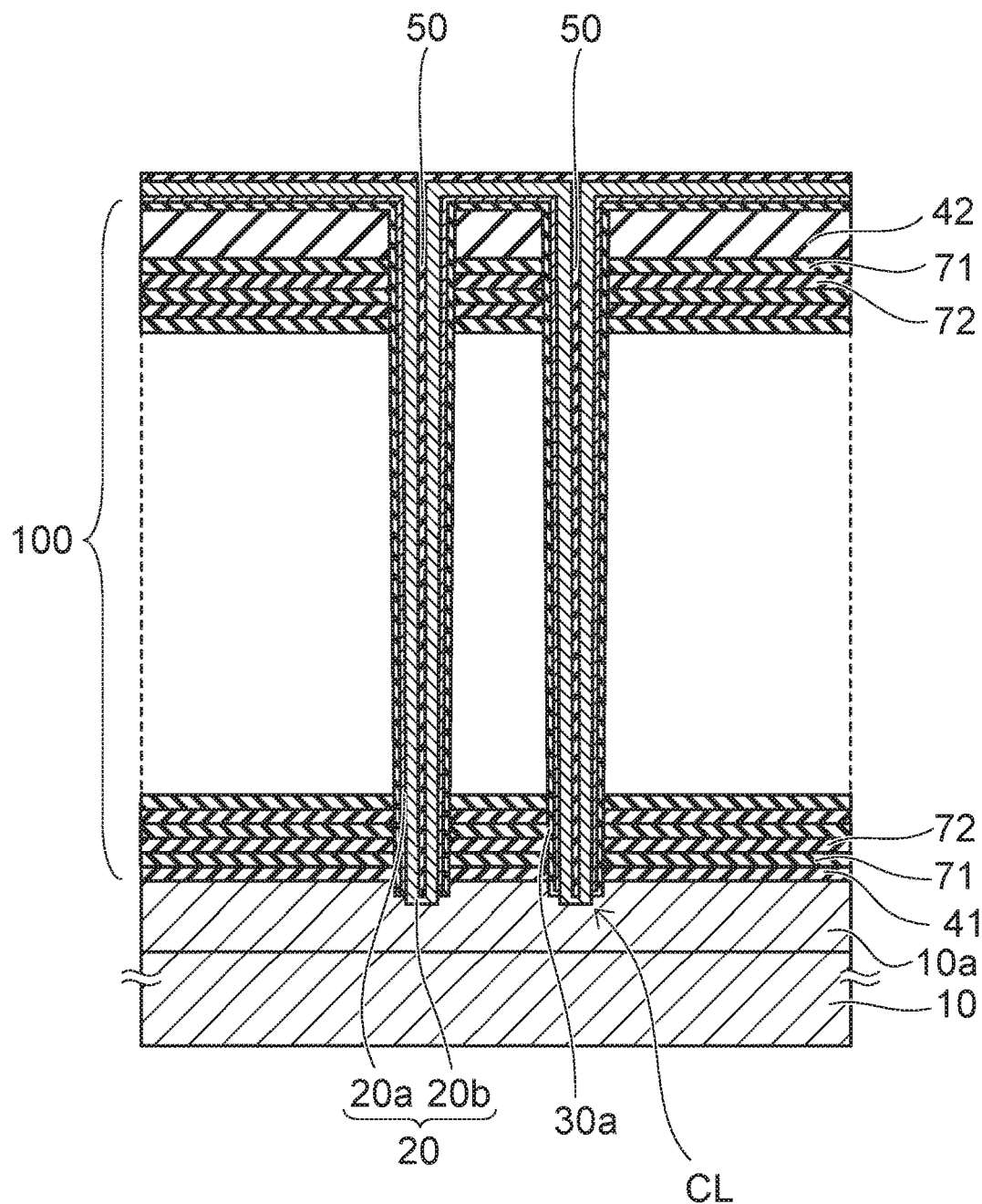

As shown in FIG. 13, the core film 50 is formed on the inner side of the silicon body 20b. Thus, the columnar portions CL that include the stacked film 30a, the semiconductor body 20, and the core film 50 are formed inside the stacked body 100.

The transverse cross-sectional configurations of the upper end portion CLa and the lower end portion CLb of the columnar portion CL are the configurations shown in FIG. 4A, FIG. 4B, FIG. 5A, or FIG. 5B to match the transverse cross-sectional configuration of the memory hole MH.

Figure 14:
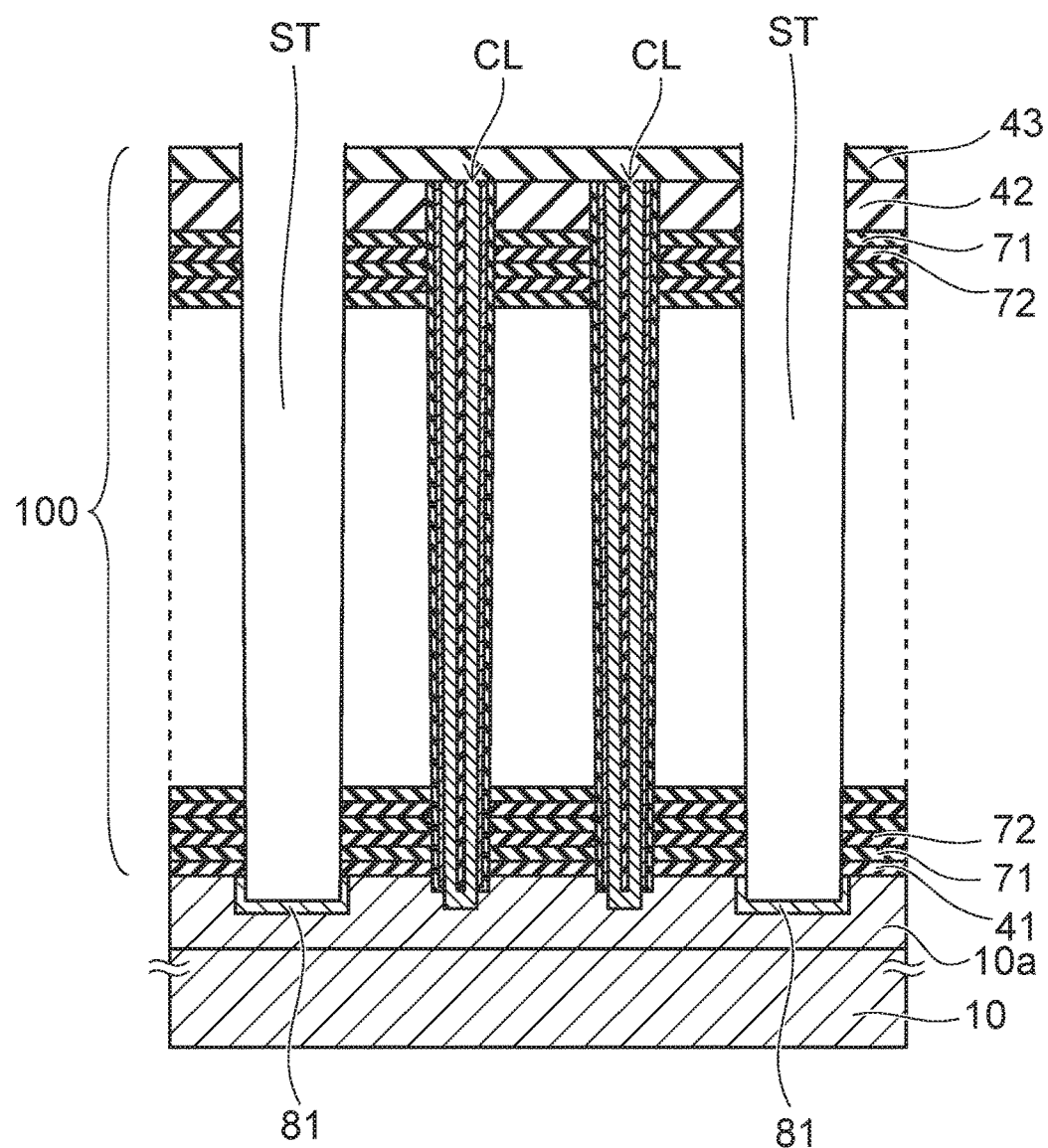

The films deposited on the insulating film 42 shown in FIG. 13 are removed by chemical mechanical polishing (CMP) or etch-back. Subsequently, as shown in FIG. 14, the insulating film 43 is formed on the insulating film 42. The insulating film 43 covers the upper ends of the columnar portions CL.

Then, a plurality of slits ST that extend in the stacking direction are made in the stacked body 100 by RIE using a not-shown mask. The slits ST pierce the stacked body 100 and reach the p-type well 10a. The slits ST extend in the X-direction shown in FIG. 1 and divide the stacked body 100 into a plurality of blocks 200 in the Y-direction.

The n-type or p-type semiconductor region 81 is formed in the front surface of the p-type well 10a at the bottoms of the slits ST by implanting an impurity by ion implantation into the p-type well 10a exposed at the bottoms of the slits ST.

Then, the sacrificial layers 71 are removed by etching through the slits ST. For example, the sacrificial layers 71 which are silicon nitride layers can be removed using an etchant containing phosphoric acid.

Figure 15:
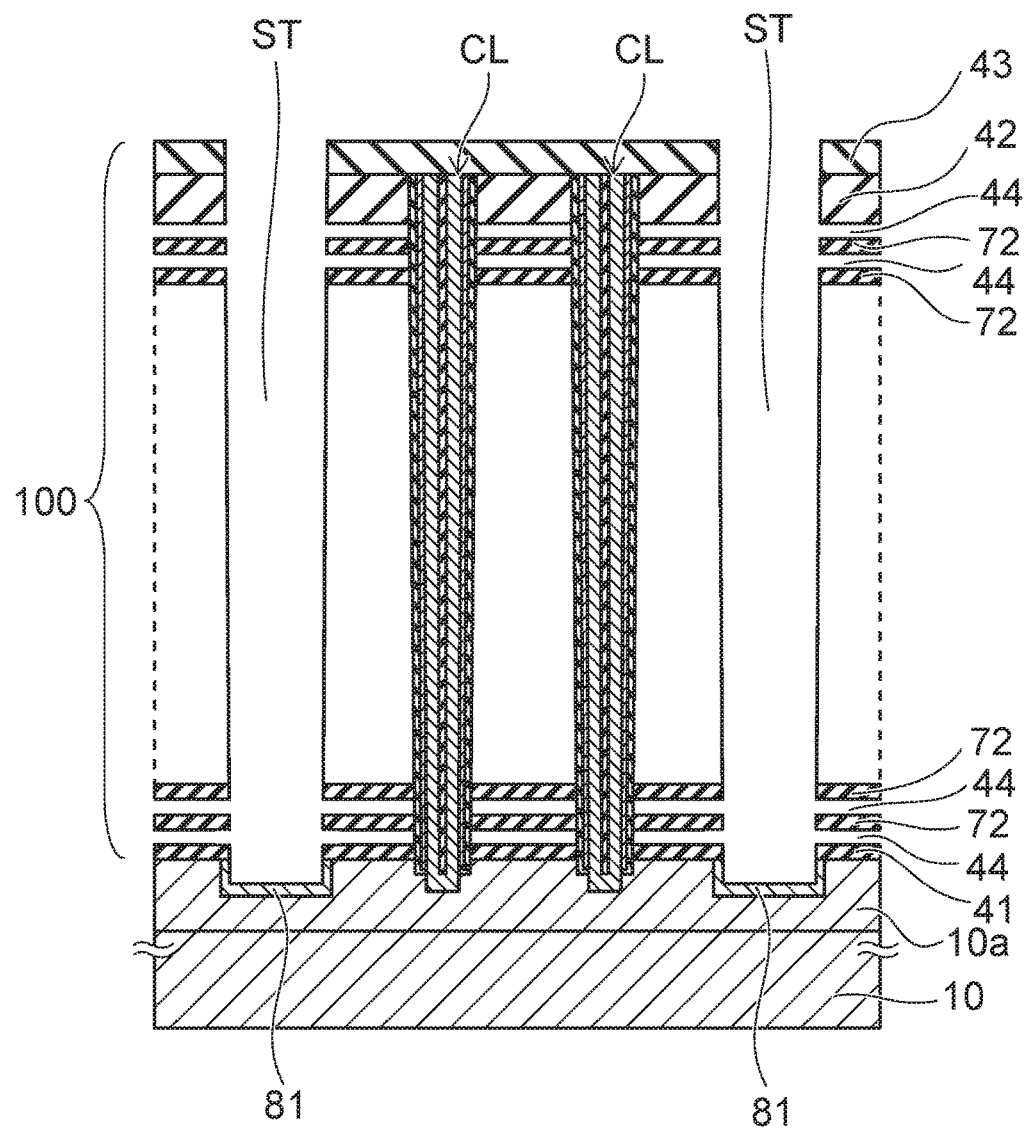

The sacrificial layers 71 are removed; and a gap 44 is made between the insulating layers 72 adjacent to each other above and below as shown in FIG. 15. The gap 44 is made also between the insulating film 41 and the lowermost insulating layer 72, and between the insulating film 42 and the uppermost insulating layer 72.

The insulating layers 72 contact the side surfaces of the columnar portions CL to surround the side surfaces of the columnar portions CL. The insulating layers 72 are supported by such a physical bond with the columnar portions CL; and the gap 44 between the insulating layers 72 is maintained.

Figure 16:
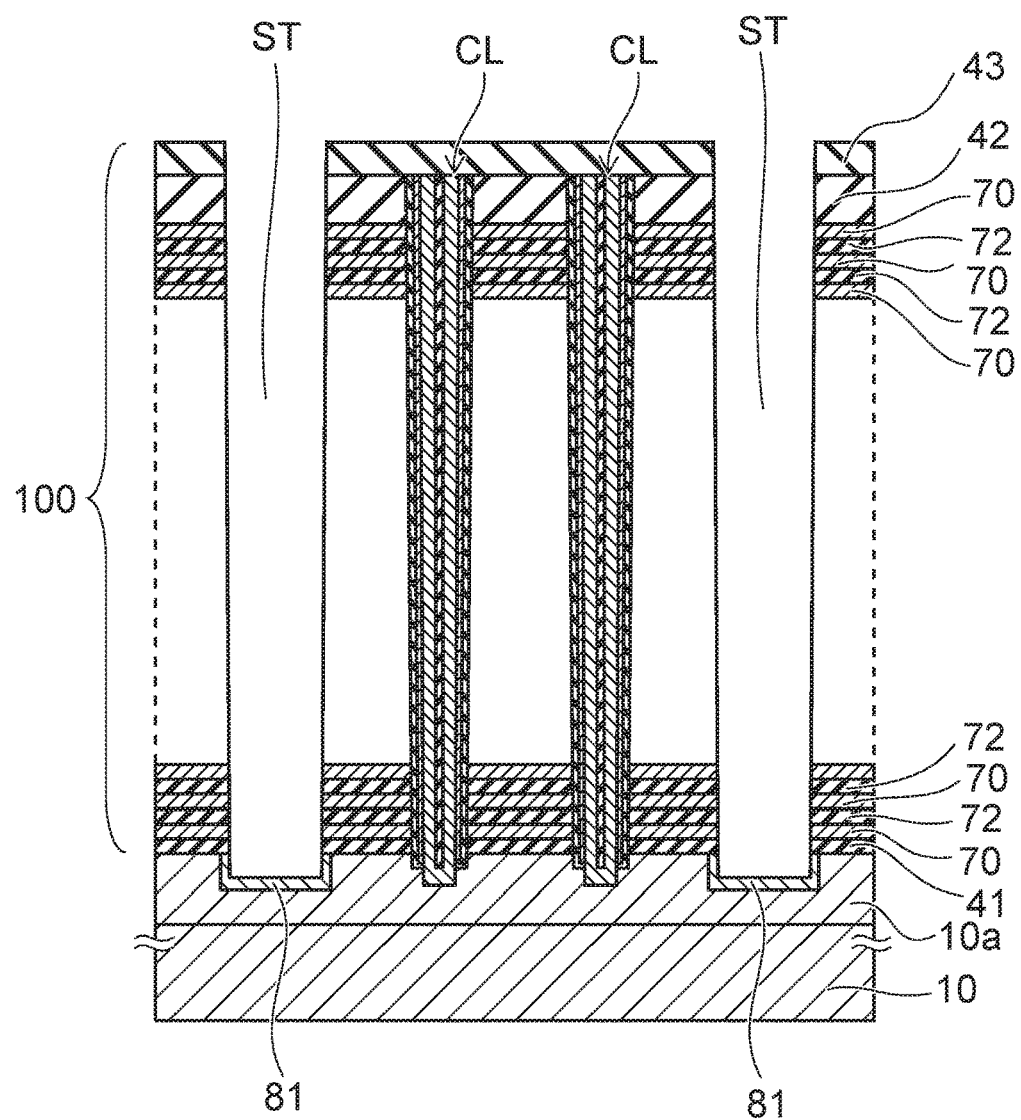

The electrode layers 70 shown in FIG. 16 are formed, with a not-shown second blocking film interposed, in the gap 44 by, for example, chemical vapor deposition (CVD). A source gas is supplied to the gap 44 through the slits ST.

Figure 17:
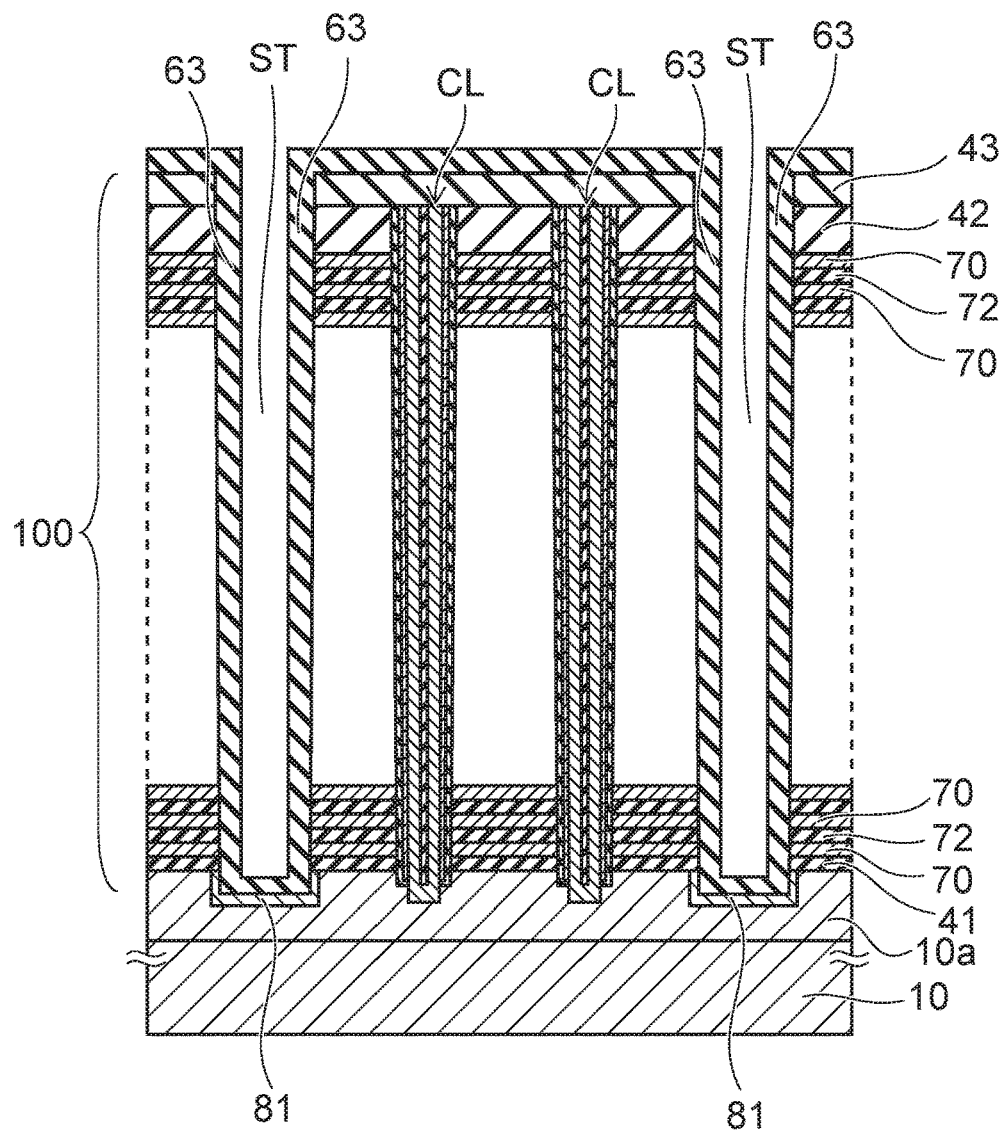

As shown in FIG. 17, the insulating film 63 is formed on the side surfaces and bottoms of the slits ST. After removing the insulating film 63 formed on the bottoms of the slits ST by RIE, the interconnect portion LI is buried in the inner side of the insulating film 63 inside the slits ST as shown in FIG. 2. The lower end portion of the interconnect portion LI contacts the p-type well 10a of the substrate 10 via the semiconductor region 81.

The results of a device simulation will now be described.

Figure 21A:
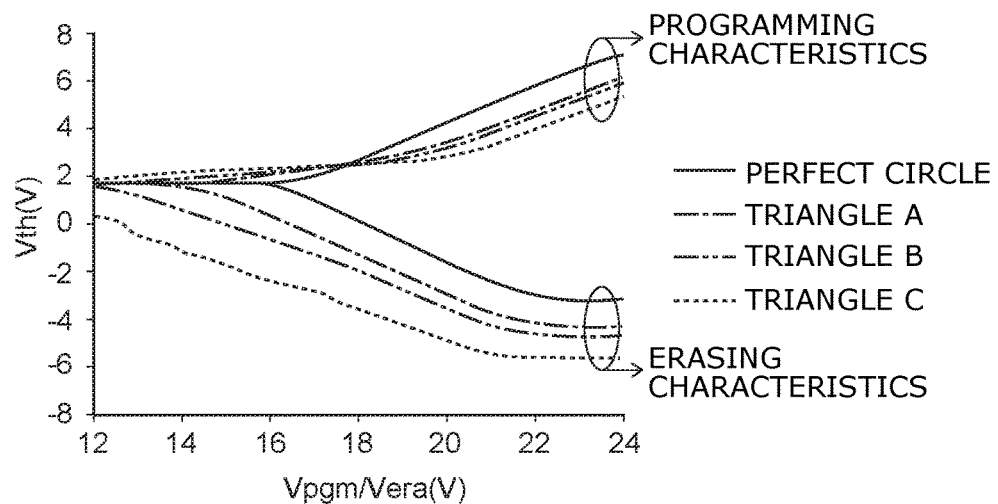
FIGS. 21A and 21B are program/erasing characteristic diagrams for a device simulation.
Figure 21B:
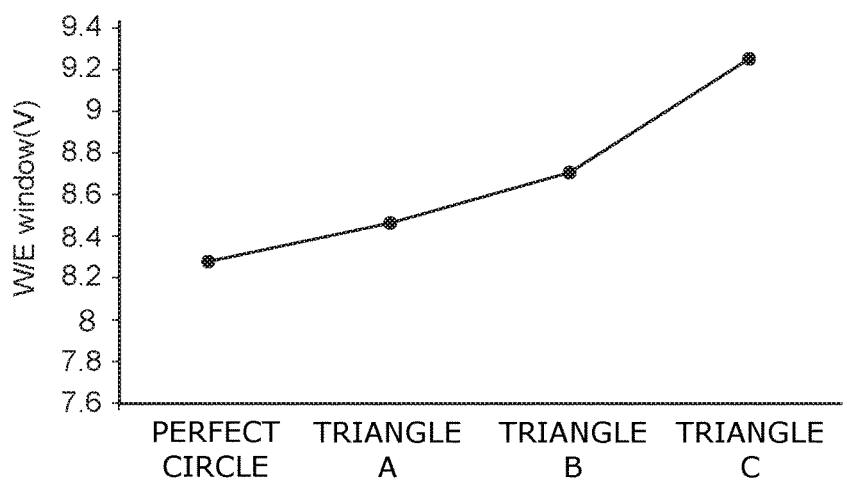

FIG. 21A and FIG. 21B are program/erasing characteristic diagrams for the device simulation. FIG. 22A to FIG. 22D are schematic views of the simulation models of FIG. 21A and FIG. 21B.

Figure 22A:
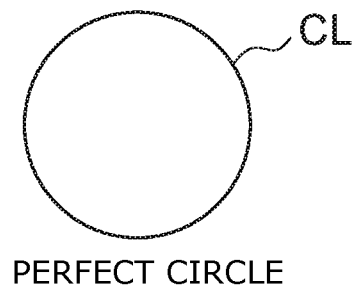
FIGS. 22A to 22D are schematic views of simulation models of FIGS. 21A and 21B.
Figure 22B:
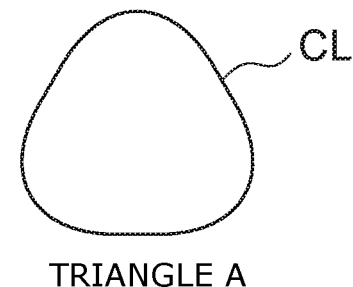
Figure 22C:
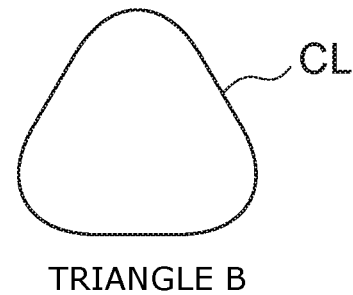
Figure 22D:
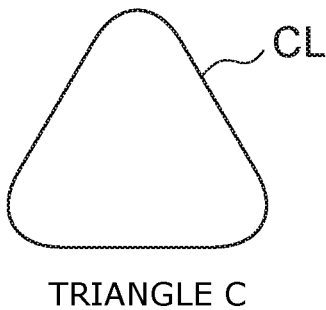

The program/erasing characteristics were simulated for the transverse cross-sectional configuration of the columnar portion CL set to be a perfect circle (FIG. 22A), a triangle A (FIG. 22B), a triangle B (FIG. 22C), and a triangle C (FIG. 22D). The surface area of the transverse cross section is the same for the perfect circle, the triangle A, the triangle B, and the triangle C.

The curvature of the corner in increasing order is the triangle A, the triangle B, and the triangle C. The curvatures of the three corners of the triangle A are smaller than the curvatures of the three corners of the triangle B; and the curvatures of the three corners of the triangle B are smaller than the curvatures of the three corners of the triangle C.

FIG. 21A shows the relationship between a programming voltage Vpgm and a threshold voltage Vth of the memory cell and the relationship between an erasing voltage Vera and the threshold voltage Vth.

The programming voltage Vpgm is the voltage applied to the control gate (the electrode layer 70) of the memory cell; and the erasing voltage Vera is the voltage applied to the semiconductor body 20.

The programming is a step-up programming method; the program time was set to be constant each cycle; and the programming voltage was stepped-up by a prescribed voltage each cycle. The erasing is a step-up erasing method; the erase time was set to be constant each cycle; and the erasing voltage was stepped-up by a prescribed voltage each cycle.

According to FIG. 21A, the superior programming characteristic (the program time to be set to a desired Vth) in degrading order is the perfect circle, the triangle A, the triangle B, and the triangle C. Conversely, the superior erasing characteristic (the erase time to be set to a desired Vth) in degrading order is the triangle C, the triangle B, the triangle A, and the perfect circle.

In the memory cells, a wider Vth margin makes multi-bit cells possible; and the Write/Erase window which is the threshold voltage difference between the programming characteristic and the erasing characteristic is one index that determines the Vth margin. Here, the Write/Erase window is the absolute value of the difference between Vth when Vpgm=21.5 V and Vth when Vera=21.5 V.

FIG. 21B shows the relationship between the Write/Erase window and the transverse cross-sectional configuration of the columnar portion CL (the perfect circle, the triangle A, the triangle B, and the triangle C).

According to FIG. 21B, the Write/Erase window is wider when the transverse cross-sectional configuration of the columnar portion CL is the triangle than when the transverse cross-sectional configuration of the columnar portion CL is the perfect circle. Further, among the triangles, the width of the Write/Erase window in degrading order is the triangle C having the large curvature of the corner, the triangle B, and the triangle A.

Similarly to FIG. 21A and FIG. 21B, FIG. 23A and FIG. 23B show the results of simulating the program/erasing characteristics for the transverse cross-sectional configuration of the columnar portion CL set to be the perfect circle, the hexagon, the quadrilateral, and the triangle. The surface area of the transverse cross section is the same for the perfect circle, the hexagon, the quadrilateral, and the triangle.

Figure 23A:
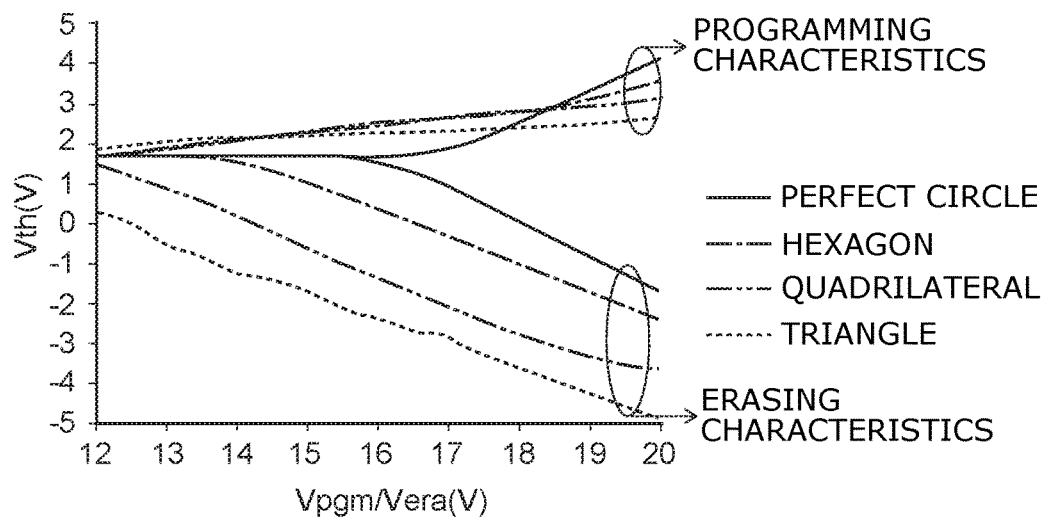
FIGS. 23A and 23B are program/erasing characteristic diagrams for a device simulation.

FIG. 23A shows the relationship between the programming voltage Vpgm and the threshold voltage Vth of the memory cell, and the relationship between the erasing voltage Vera and the threshold voltage Vth.

According to FIG. 23A, the superior programming characteristic (the program time to be set to a desired Vth) in degrading order is the perfect circle, the hexagon, the quadrilateral, and the triangle. Conversely, the superior erasing characteristic (the erase time to be set to a desired Vth) in degrading order is the triangle, the quadrilateral, the hexagon, and the perfect circle.

Figure 23B:
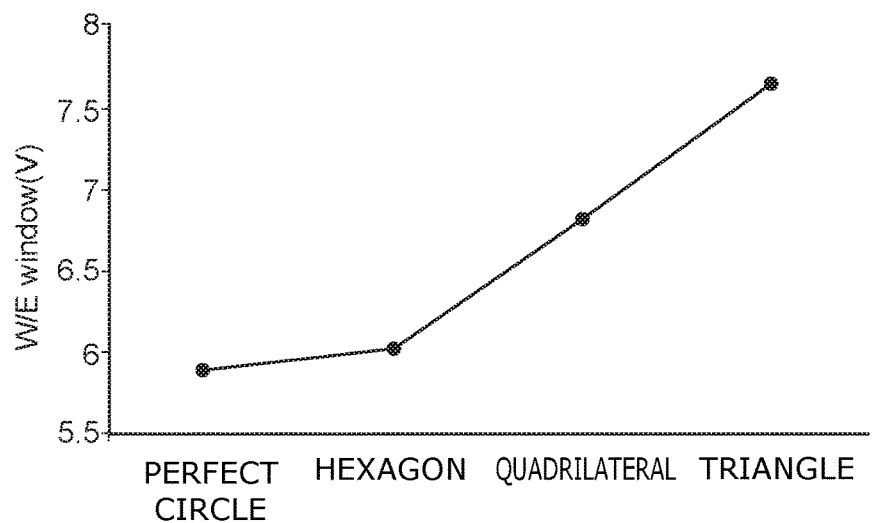

FIG. 23B shows the relationship between the Write/Erase window and the transverse cross-sectional configuration of the columnar portion CL (the perfect circle, the hexagon, the quadrilateral, and the triangle). Here, the Write/Erase window is the absolute value of the difference between Vth when Vpgm=20 V and Vth when Vera=20 V.

According to FIG. 23B, the width of the Write/Erase window for the transverse cross-sectional configuration of the columnar portion CL in degrading order is the triangle, the quadrilateral, the hexagon, and the perfect circle.

For the condition in which the same program/erasing voltage is applied to the portion where the transverse cross-sectional area of the columnar portion CL is large and the portion where the transverse cross-sectional area of the columnar portion CL is small, compared to the portion where the transverse cross-sectional area of the columnar portion CL is small, the electric field is not applied easily to the tunneling insulating film 31 and there is a tendency for the programming/erasing speed of the data to be slow in the portion where the transverse cross-sectional area of the columnar portion CL is large. Further, compared to the portion where the transverse cross-sectional area of the columnar portion CL is small, there is a tendency for the Write/Erase window to become narrow in the portion where the transverse cross-sectional area of the columnar portion CL is large.

According to the embodiment, the transverse cross-sectional configuration of the upper end portion CLa having the large transverse cross-sectional area of the columnar portion CL is set to be a triangle or a pseudo-triangle as shown in FIG. 4A and FIG. 4B; and the transverse cross-sectional configuration of the lower end portion CLb is set to be substantially a circle as shown in FIG. 4B or a pseudo-triangle having corners having smaller curvatures than those of the upper end portion CLa as shown in FIG. 4A. From the results of FIG. 21B, for the transverse cross-sectional configuration of the columnar portion CL, the Write/Erase window is wider for the triangle than for the perfect circle; and the Write/Erase window becomes wider as the curvature of the corner of the triangle increases.

Therefore, the fluctuation of the Write/Erase windows of the upper end portion CLa and the lower end portion CLb due to the difference of the transverse cross-sectional areas can be compensated by the difference of the transverse cross-sectional configurations.

A relationship of the Write/Erase window being wider for the upper end portion CLa than for the lower end portion CLb, i.e., the relationship that is the reverse of the relationship of the Write/Erase window being narrower for the upper end portion CLa than for the lower end portion CLb which is dependent on the difference of the transverse cross-sectional areas, can be provided to the upper end portion CLa and the lower end portion CLb by the difference of the transverse cross-sectional configurations.

This reduces the characteristic fluctuation between the memory cells MC on the upper layer side and the memory cells MC on the lower layer side. Also, the memory cells MC on the upper layer side and the memory cells MC on the lower layer side can be operated at the same program/erasing voltage; and the setting of the operating voltage is easy.

Also, according to the embodiment, the transverse cross-sectional configuration of the upper end portion CLa having the large transverse cross-sectional area of the columnar portion CL is set to be a quadrilateral or a pseudo-quadrilateral as shown in FIG. 5A and FIG. 5B; and the transverse cross-sectional configuration of the lower end portion CLb is set to be substantially a circle as shown in FIG. 5B or a pseudo-quadrilateral having corners having smaller curvatures than the upper end portion CLa as shown in FIG. 5A.

From the results of FIG. 23B, for the transverse cross-sectional configuration of the columnar portion CL, the Write/Erase window is wider for the quadrilateral than for the perfect circle.

Also, FIG. 23B shows that the Write/Erase window becomes narrow as the number of corners increases and the configuration approaches the perfect circle. Accordingly, the Write/Erase window is narrower for a configuration that has small curvatures and approaches a perfect circle such as the lower end portion CLb of FIG. 5A than for the quadrilateral of the upper end portion CLa. Conversely, it can be said that the Write/Erase window is wider for the upper end portion CLa than for the lower end portion CLb because the upper end portion CLa has corners having curvatures larger than the curvatures of the corners of the lower end portion CLb.

Thus, in the examples of FIG. 5A and FIG. 5B as well, the fluctuation of the Write/Erase windows of the upper end portion CLa and the lower end portion CLb due to the difference of the transverse cross-sectional areas can be compensated by the difference of the transverse cross-sectional configurations.

A relationship in which the Write/Erase window is wider for the upper end portion CLa than for the lower end portion CLb, i.e., the relationship that is the reverse of the relationship of the Write/Erase window being narrower for the upper end portion CLa than for the lower end portion CLb which is dependent on the difference of the transverse cross-sectional areas, can be provided to the upper end portion CLa and the lower end portion CLb by the difference of the transverse cross-sectional configurations.

This reduces the characteristic fluctuation between the memory cells MC on the upper layer side and the memory cells MC on the lower layer side. Also, the memory cells MC on the upper layer side and the memory cells MC on the lower layer side can be operated at the same program/erasing voltage; and the setting of the operating voltage is easy.

Figure 18:
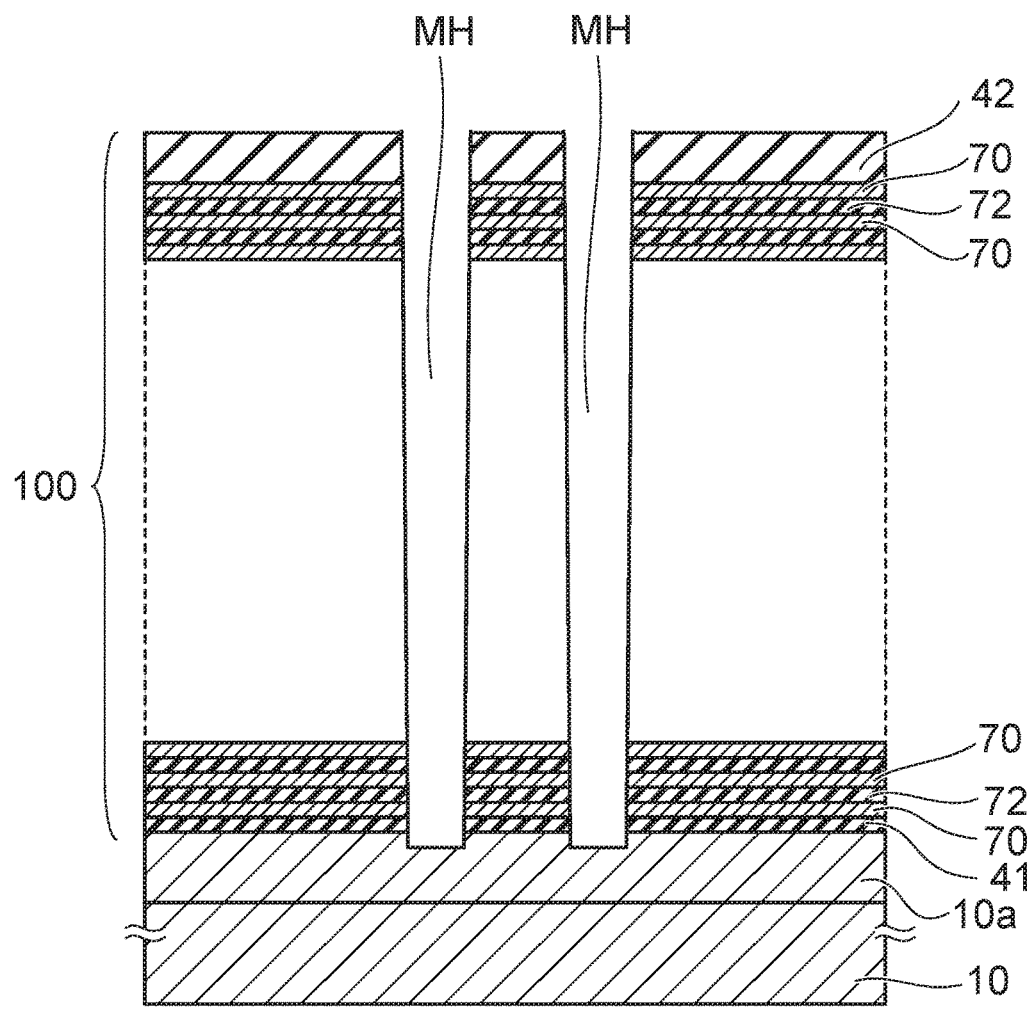

In the embodiment recited above, the first layers are not limited to the sacrificial layers 71. As shown in FIG. 18, the memory holes MH may be made in the stacked body 100 including the electrode layers 70 as the first layers and the insulating layers 72 as the second layers. In such a case, the process of replacing the sacrificial layers 71 with the electrode layers 70 is unnecessary.

Also, the insulating layers 72 may be removed by etching through the slits ST after the process shown in FIG. 16. For example, the insulating layer 72 which are silicon oxide layers can be removed using an etchant containing hydrofluoric acid.

Figure 19A:
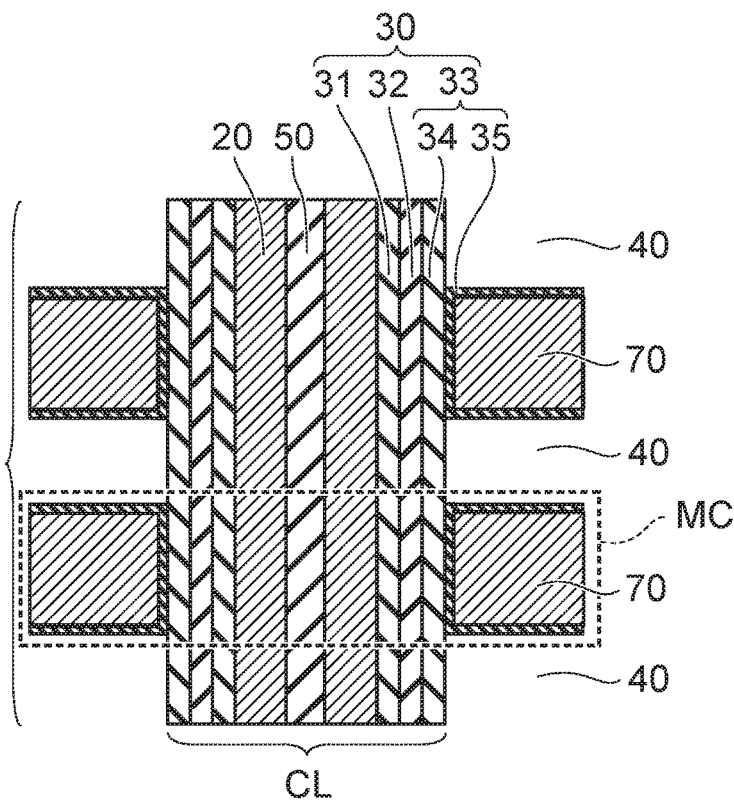
FIGS. 19A and 19B are schematic cross-sectional views of another example of a memory cell of the embodiment.

The insulating layers 72 are removed; and an air gap 40 is made between the electrode layers 70 adjacent to each other above and below as shown in FIG. 19A. The electrode layers 70 contact the side surfaces of the columnar portions CL to surround the side surfaces of the columnar portions CL. The electrode layers 70 are supported by such a physical bond with the columnar portions CL; and the air gap 40 between the electrode layers 70 is maintained.

The air gap 40 is made as an insulator between the electrode layers 70 which are the control gates of the memory cells MC adjacent to each other in the stacking direction. The air gap 40 that has a lower dielectric constant than an insulating film such as a silicon oxide film, etc., reduces the interconnect capacitance between the electrode layers 70 above and below and makes high-speed operation of the memory cells MC possible. Further, the interference between adjacent cells such as the threshold fluctuation due to the capacitive coupling between the electrode layers 70 above and below, etc., can be suppressed.

Figure 19B:
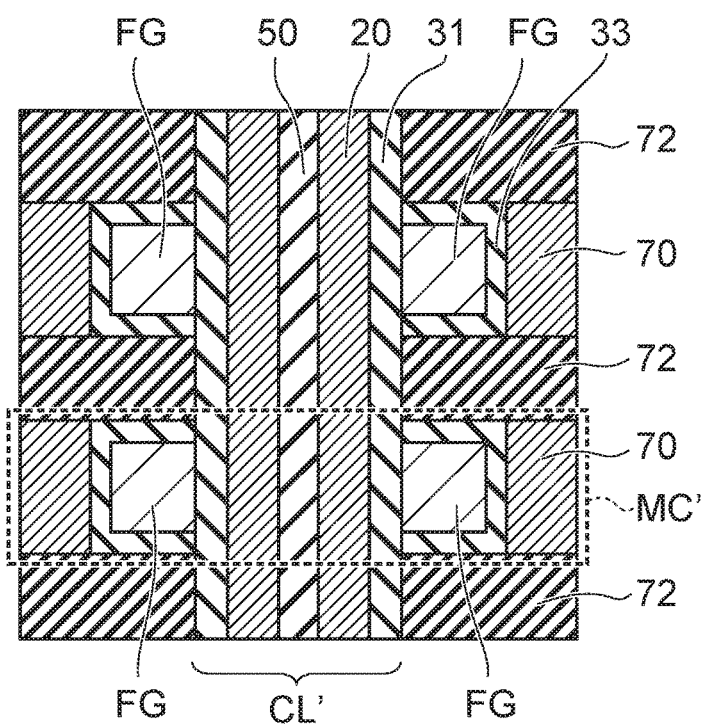

FIG. 19B is a schematic cross-sectional view of another example of the memory cell of the embodiment.

A memory cell MC' shown in FIG. 19B includes a floating gate FG as a charge storage portion. For example, the floating gate FG contains mainly polycrystalline silicon. The floating gate FG is provided between a columnar portion CL' and the electrode layer 70.

The columnar portion CL' includes the tunneling insulating film 31, the core film 50, and the semiconductor body 20 provided between the tunneling insulating film 31 and the core film 50. The columnar portion CL' is formed inside the memory hole MH described above. The tunneling insulating film 31, the semiconductor body 20, and the core film 50 are formed inside the memory hole MH in order. Similar to the columnar portion CL described above, the columnar portion CL' also includes the upper end portion and the lower end portion having transverse cross-sectional configurations.

The floating gate FG is provided between the electrode layer 70 and the tunneling insulating film 31 which is the outermost circumferential portion of the columnar portion CL'. The floating gate FG contacts the tunneling insulating film 31.

The blocking insulating film 33 is provided between the floating gate FG and the electrode layer 70. The blocking insulating film 33 is provided also between the floating gate FG and the insulating layer 72. A plurality of floating gates FG are arranged to be separated in the stacking direction of the stacked body 100.

Figure 20:
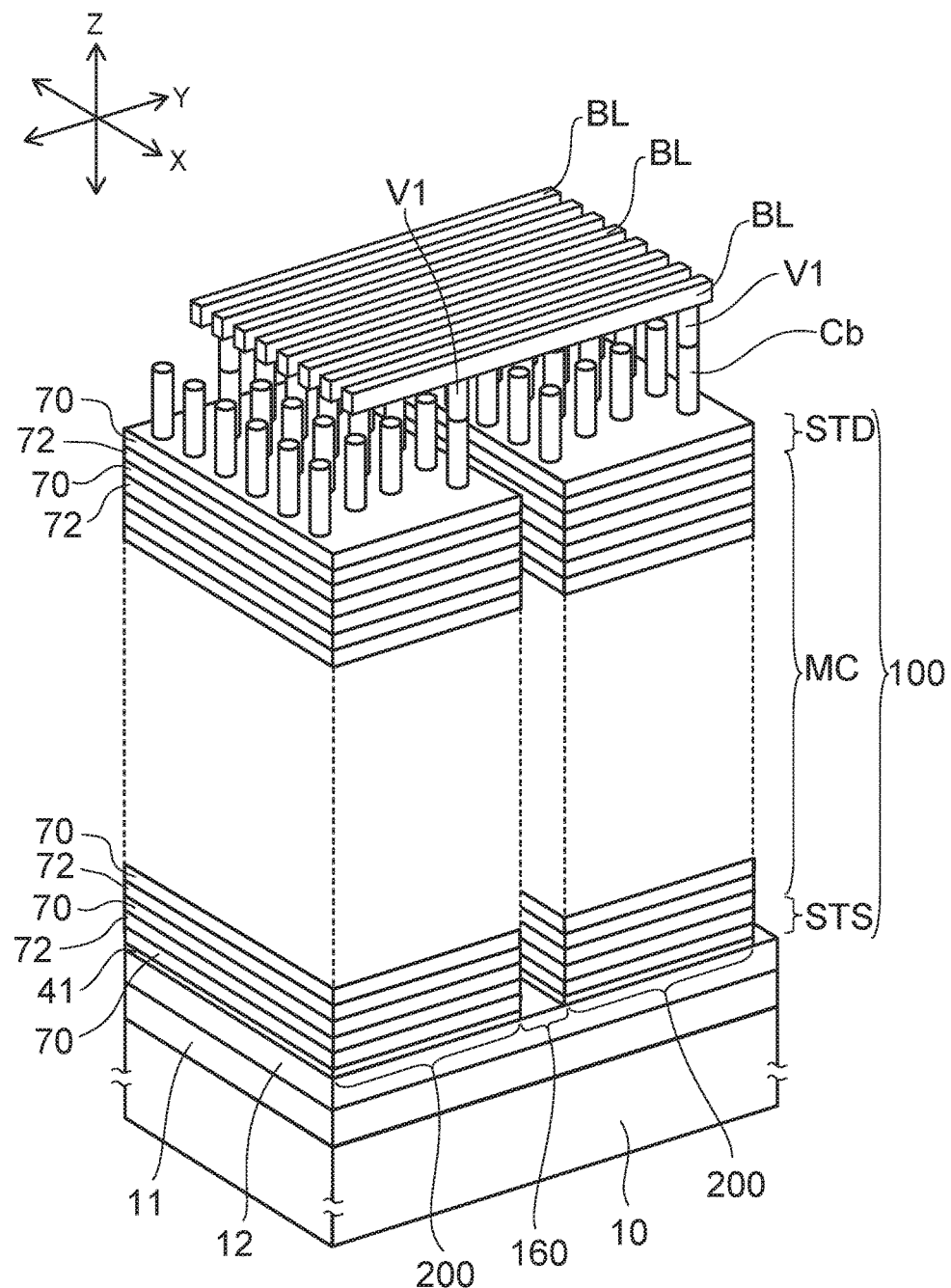
FIG. 20 is a schematic perspective view of another example of the semiconductor device of the embodiment.

FIG. 20 is a schematic perspective view of another example of the memory cell array of the embodiment.

A first foundation layer 11 and a second foundation layer 12 are provided between the substrate 10 and the stacked body 100. The first foundation layer 11 is provided between the substrate 10 and the second foundation layer 12; and the second foundation layer 12 is provided between the first foundation layer 11 and the stacked body 100.

The second foundation layer 12 is a semiconductor layer or a conductive layer. Or, the second foundation layer 12 may include a stacked film of a semiconductor layer and a conductive layer.

The first foundation layer 11 includes interconnects and transistors forming a control circuit.

The lower end of the semiconductor body 20 of the columnar portion CL contacts the second foundation layer 12; and the second foundation layer 12 is connected to the control circuit. Accordingly, the lower end of the semiconductor body 20 of the columnar portion CL is electrically connected to the control circuit via the second foundation layer 12. The second foundation layer 12 can be used as a source layer.

The stacked body 100 is divided into a plurality of blocks (or finger portions) 200 in the Y-direction by a separation portion 160. The separation portion 160 is an insulating film and does not include an interconnect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a foundation layer;
a stacked body provided above the foundation layer, the stacked body including a plurality of electrode layers stacked with an insulator interposed; and
a columnar portion having an upper portion and a lower portion, and including a semiconductor body extending in a stacking direction through the stacked body, and a charge storage film provided between the semiconductor body and the electrode layers,
wherein:
a surface area of a transverse cross section of the upper portion of the columnar portion is greater than a surface area of a transverse cross section of the lower portion of the columnar portion,
a configuration of the transverse cross section of the upper portion is a triangle or a pseudo-triangle having three corners, or a quadrilateral or a pseudo-quadrilateral having four corners,
a configuration of the transverse cross section of the lower portion is substantially a circle,
the electrode layers include a plurality of control gates opposing the semiconductor body with the charge storage film interposed,
the upper portion of the columnar portion is adjacent to an upper layer portion of the stacked body including a control gate of an uppermost layer of the control gates, and
the lower portion of the columnar portion is adjacent to a lower layer portion of the stacked body including a control gate of a lowermost layer of the control gates.

2. A semiconductor device, comprising:
a foundation layer;
a stacked body provided above the foundation layer, the stacked body including a plurality of electrode layers stacked with an insulator interposed;
a columnar portion having an upper portion and a lower portion, and including a semiconductor body extending in a stacking direction through the stacked body; and
charge storage portions provided between the columnar portion and the electrode layers,
wherein:
a surface area of a transverse cross section of the upper portion of the columnar portion is greater than a surface area of a transverse cross section of the lower portion of the columnar portion,
a configuration of the transverse cross section of the upper portion is a triangle or a pseudo-triangle having three corners, or a quadrilateral or a pseudo-quadrilateral having four corners,
a configuration of the transverse cross section of the lower portion is substantially a circle,
the electrode layers include a plurality of control gates opposing the semiconductor body with the charge storage portions interposed,
the upper portion of the columnar portion is adjacent to an upper layer portion of the stacked body including a control gate of an uppermost layer of the control gates, and
the lower portion of the columnar portion is adjacent to a lower layer portion of the stacked body including a control gate of a lowermost layer of the control gates.

* * * * *